United States Patent
Igarashi et al.

(10) Patent No.: US 8,724,260 B2
(45) Date of Patent: May 13, 2014

(54) INFORMATION RECORDING DEVICE HAVING HIGH-FREQUENCY FIELD GENERATING MULTILAYER MATERIAL WITH A RECEDED SECTION DISPOSED BETWEEN MAIN AND OPPOSING POLES

(75) Inventors: Masukazu Igarashi, Kawagoe (JP); Harukazu Miyamoto, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 75 days.

(21) Appl. No.: 13/128,010

(22) PCT Filed: Nov. 10, 2009

(86) PCT No.: PCT/JP2009/069083
§ 371 (c)(1),
(2), (4) Date: May 6, 2011

(87) PCT Pub. No.: WO2010/053187
PCT Pub. Date: May 14, 2010

(65) Prior Publication Data
US 2011/0216436 A1  Sep. 8, 2011

(30) Foreign Application Priority Data
Nov. 10, 2008  (JP) ................................. 2008-287287

(51) Int. Cl.
*G11B 5/31* (2006.01)
*G11B 5/235* (2006.01)

(52) U.S. Cl.
USPC ............... 360/125.3; 360/119.03; 360/119.04

(58) Field of Classification Search
CPC . G11B 5/235; G11B 5/314; G11B 2005/0024
USPC ............... 360/119.02, 119.03, 119.04, 125.3
See application file for complete search history.

(56) References Cited

U.S. PATENT DOCUMENTS

2005/0023938 A1  2/2005  Sato et al.
2005/0219771 A1  10/2005  Sato et al.
(Continued)

FOREIGN PATENT DOCUMENTS

JP  7-244801  9/1995
JP  2005-25831  1/2005
(Continued)

OTHER PUBLICATIONS

S. I. Kiselev et al., Microwave oscillations of a nanomagnet driven by a spin-polarized current, Nature, Sep. 25, 2003, pp. 380-383, vol. 425, www.nature.com/nature.
(Continued)

*Primary Examiner* — Craig A. Renner
(74) *Attorney, Agent, or Firm* — Antonelli, Terry, Stout & Kraus, LLP.

(57) ABSTRACT

Excellent magnetization switching of a magnetic recording medium is promoted in microwave assisted magnetic recording to provide a highly-reliable high-density information recording device. A receded section from an air bearing surface is arranged at an end section in a write track width direction on an FGL laminate film for generating a high-frequency field. Alternatively, a cross section of the FGL laminate film (plane perpendicular to the direction of the flow of the electric current) has an inverted trapezoid shape or has a structure in which the area of the cross section increases with distance from the main pole. Since an excellent recording pattern is formed on the recording medium, areal recording density in the information recording device can be increased, and the reliability can be improved at the same time. As a result, the cost can be reduced.

10 Claims, 19 Drawing Sheets

(56) References Cited

U.S. PATENT DOCUMENTS

| | | |
|---|---|---|
| 2008/0112087 A1 | 5/2008 | Clinton et al. |
| 2009/0052095 A1 | 2/2009 | Yamada et al. |
| 2009/0059423 A1* | 3/2009 | Yamada et al. ............... 360/122 |
| 2009/0097167 A1 | 4/2009 | Sato et al. |
| 2009/0097169 A1 | 4/2009 | Sato et al. |
| 2009/0316304 A1* | 12/2009 | Funayama et al. ....... 360/125.03 |
| 2011/0038080 A1* | 2/2011 | Alex et al. ................ 360/123.02 |
| 2011/0038081 A1* | 2/2011 | Contreras et al. ........ 360/125.03 |
| 2011/0090603 A1* | 4/2011 | Bai ............................... 360/319 |
| 2011/0205655 A1* | 8/2011 | Shimizu et al. ............... 360/319 |

FOREIGN PATENT DOCUMENTS

| | | |
|---|---|---|
| JP | 2005-285242 | 10/2005 |
| JP | 2008-123669 | 5/2008 |
| JP | 2009-70541 | 4/2009 |

OTHER PUBLICATIONS

Jian-Gang Zhu et al., Microwave Assisted Magnetic Recording, IEEE Transactions on Magnetics, Jan. 2008, vol. 44, No. 1, p. 125, B6, pp. 34-35.

* cited by examiner w w w w w w w w w

Fig. 10G-a
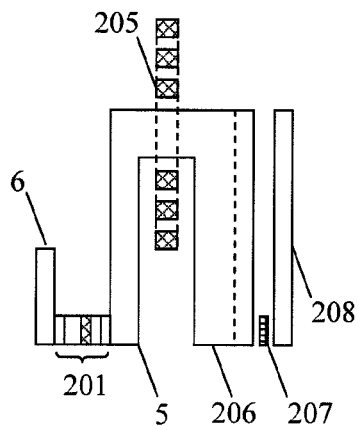
Fig. 10G-b
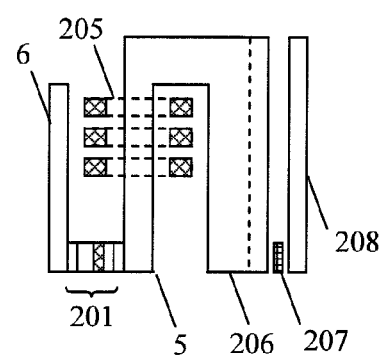
Fig. 10G-c
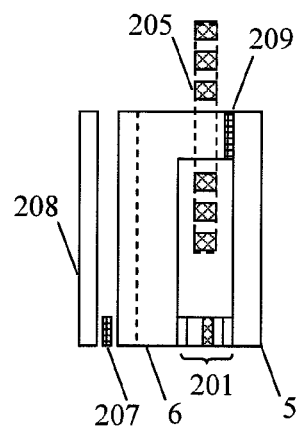
Fig. 10G-d
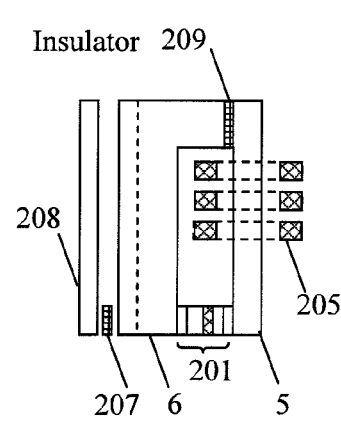
Direction of head running

INFORMATION RECORDING DEVICE HAVING HIGH-FREQUENCY FIELD GENERATING MULTILAYER MATERIAL WITH A RECEDED SECTION DISPOSED BETWEEN MAIN AND OPPOSING POLES

TECHNICAL FIELD

The present invention relates to an information recording device that has a function of applying a high-frequency field to a magnetic recording medium to excite magnetic resonance to induce magnetization switching of the recording medium to record information.

BACKGROUND ART

In magnetic recording, one of the indicators of performance is that a magnetic recording medium with large magnetic coercive force can be used. There is an idea from a long ago, in which a high-frequency field is applied to the magnetic recording medium during magnetic recording to temporarily weaken the magnetic coercive force of a recording area, and then a recording bit is formed by a head magnetic field. For example, JP 7-244801A (1995) (Patent Literature 1) discloses a recording method of applying Joule heating or magnetic resonance heating to a magnetic recording medium by a high-frequency field to locally reduce the magnetic coercive force of medium.

Along with the improvement in the areal recording density, a recording system called "microwave assisted magnetic recording" that also uses the high-frequency is focusing attention again in recent years. In the microwave assisted magnetic recording, a high-frequency field of a strong microwave band is applied to an area of nanometer order to locally excite a recording medium to reduce a switching field to record information. Since the magnetic resonance is used, a large reduction effect of the switching field cannot be obtained unless a high-frequency field with a strong frequency proportional to a magnetic anisotropy effective field of the recording medium is used.

JP 2005-025831A (Patent Literature 2) discloses a high-frequency oscillation element intended for microwave assisted magnetic recording, the element having a structure including a laminate file with a structure similar to a GMR element (giant magnetoresistance effect element) placed between electrodes. The element can inject conduction electrons with spin fluctuation generated in a GMR structure to a magnetic material through a non-magnetic material to generate a minute high-frequency oscillation magnetic field. Similarly, Nature 425, 380 (2003) (Non Patent Literature 1) reports microwave oscillation based on a spin torque.

"Microwave Assisted Magnetic Recording" described in TMRC 2007-B6 lecture proceeding (Non Patent Literature 2) discloses a technique, in which a magnetization fast rotating body (Field Generation Layer: hereinafter, abbreviated as "FGL") that is rapidly rotated by the spin torque is arranged near a magnetic recording medium adjacent to a main pole of a perpendicular magnetic head to generate a microwave (high-frequency field), and information is recorded in the magnetic recording medium with large magnetic anisotropy.

CITATION LIST

Patent Literature

Patent Literature 1: JP 7-244801A (1995)
Patent Literature 2: JP 2005-025831A

Non Patent Literature

Non Patent Literature 1: Nature 425, 380 (2003)
Non Patent Literature 2: "Microwave Assisted Magnetic Recording": TMRC 2007-B6 Lecture Proceeding

SUMMARY OF INVENTION

Technical Problem

In recent years, the areal recording density required in magnetic recording is just over 1 T bits per square inch. To realize this level of areal recording density in the microwave assisted magnetic recording, a strong high-frequency field needs to be applied to an area of nanometer order to locally set the magnetic recording medium to a magnetic resonance state, and the switching field needs to be reduced to record information.

In the techniques disclosed in Patent Literatures 1 and 2 and Non Patent Literature 1, the frequency of the generated high-frequency field is too low, or the magnetic intensity is too weak. Therefore, it is difficult to realize the high areal recording density of 1 T bits/square inch.

A moderately strong magnetic field can be generated if the technique disclosed in Non Patent Literature 2 is used. However, the magnetization rotating body (FGL) in which the magnetization is rotated by the spin torque is fixed in the fringing field direction from the main pole, and there is a disadvantage that the high-frequency oscillation is not actually maintained. Even if a measure is taken to reduce the effect of the fringing field from the main pole, the magnetization direction of the spin source is fixed. Therefore, the relationship between the main pole field components perpendicularly applied to the FGL and the direction of the spin torque flown into the FGL depends on the polarity of the main pole. The magnetization needs to rotate in one direction in the FGL plane to obtain the intensity of the high-frequency field to the maximum extent. If the technique disclosed in Non Patent Literature 2 is used, the optimal drive current value varies depending on the polarity of the main pole. Therefore, there is a disadvantage that the frequency of the obtained high-frequency field varies, and excellent writing cannot be performed.

Meanwhile, as a result of studies, the inventors of the present invention have found out that the inflow magnetic field from the main pole to the high-frequency field generator becomes perpendicular to the film surface by arranging a laminate file constituting the FGL adjacent to a lip provided to the main pole.

According to the configuration, the main pole or the opposing pole is used as the spin source. Therefore, the value of the drive current does not have to be changed in accordance with the polarity of the main pole, and a design for always obtaining the maximum intensity of the high-frequency field in accordance with a desired frequency is possible. As the main pole or the opposing pole is used as the spin source, the main pole field component perpendicularly applied to the FGL and the direction of the spin torque flowing into the FGL are switched at the same time in synchronization with the switching of the main pole polarity. Therefore, the oscillation state does not depend on the polarity of the main pole. As a result, the oscillation at the optimal high-frequency field frequency determined in accordance with the used recording medium is realized without changing the drive current of the FGL.

However, even in the magnetic head using the lip, it has become clear that the magnetic recording becomes difficult with reduction in the write track width. In the head for microwave assisted magnetic recording using the FGL, the width of the FGL needs to be narrowed down in accordance with the write track width. However, it has been found that as the width of the FGL is narrowed down, there is a new problem that the over-write property is degraded or the jitter noise increases. The problem is particularly noticeable in the drive without a change in the rotation direction of the magnetization of the FGL in accordance with the polarity of the main pole.

An object of the present invention is to solve the problems occurred along with the narrowing down of the track in an information recording device that performs magnetic recording by also using a high-frequency field generated by an FGL to realize an information recording device with high recording reading performance.

Solution to Problem

As described, in the information recording device that uses the FGL as the high-frequency generator, the length in the write track width direction of the FGL needs to be reduced to narrow down the track. If the length in the write track width direction is reduced, the influence on the entire write magnetic field caused by the magnetic field generated from the side of the FGL cannot be ignored.

Meanwhile, as a result of the analysis of the high-frequency field generated by the FGL by the inventors of the present invention, it has been found that not only the size of the magnetic field, but also the direction of the magnetic field changes over time. The change in the direction of the magnetic field does not have much effect if the width of the FGL is greater than the length in the height direction. However, the change in the direction of the magnetic field cannot be ignored if the width of the FGL is narrowed down. The effect of the generated field from the ABS side of the FGL emerges in a form of a change in the direction of the magnetic field in synchronization with the rotation of the FGL magnetization on the recording medium, because the generated field from the air bearing surface of the FGL and the phase are shifted 90 degrees. In the high-frequency field felt by the recording medium, components (rotation direction) contributing to desired magnetization switching and components (rotation direction) for switching the switched magnetization again are off-balance.

If the effect of the generated field from the side of the FGL can be ignored, the high-frequency field felt by the recording medium does not rotate (linear polarized field). Therefore, the components contributing to the desired magnetization switching and the components for switching the switched magnetization are balanced. If the writing field from the main pole is sufficient, the bias to the desired magnetization switching is possible. However, when the rotation direction of the magnetization of the FGL is constant, the possibility of the switched magnetization switching again is high if an attempt is made to form the magnetization switching pattern when the components are off-balance. Even if the components are balanced, there is a strong action of switching the switched magnetization again if the high-frequency field is too strong compared to the writing field from the main pole.

As a result, the transition width (boundary width between the bit and the adjacent bit) of the recording bit becomes wide for a continuous medium or a discrete track medium (DTM), such as a granular medium. Therefore, it is predicted that the possibility that the magnetization of the pattern cannot be switched for a bit patterned medium (BPM) becomes high.

As a result of field analysis, the inventors of the present invention have found out that effect of the change in the direction of the magnetic field and the magnetic field from the side can be reduced by arranging a section (hereinafter, called "receded section") receded as seen from an air bearing surface (ABS: surface opposing the information recording medium of the magnetic head) at an end section in the write track width direction of the FGL. The shape of the receded section may be a simple stepped shape or may be a shape receded in a tapered shape from the air bearing surface. Alternatively, the shape may be a more complicated shape.

Details of the foregoing will be described in the following embodiments, and problems and action effects of low-order inventions included in the present invention will also be described.

Advantageous Effects of Invention

An information recording device with the areal recording density exceeding 1 T bits per square inch can be realized, and the reliability can be improved at the same time. As a result, the cost can be reduced.

BRIEF DESCRIPTION OF DRAWINGS

FIG. 10G-*a* is a diagram showing an example of configuration of a magnetic head.

FIG. 10G-*b* is a diagram showing an example of configuration of the magnetic head.

FIG. 10G-*c* is a diagram showing an example of configuration of the magnetic head.

FIG. 10G-*d* is a diagram showing an example of configuration of the magnetic head.

DESCRIPTION OF EMBODIMENTS

Hereinafter, specific embodiments of the present invention will be described in detail using the drawings. Before the detailed description of specific configurations, a principle of the present invention (relationship between a receded section and a reduction in the effect of a side magnetic field) will be described using the drawings.

Figure 1:
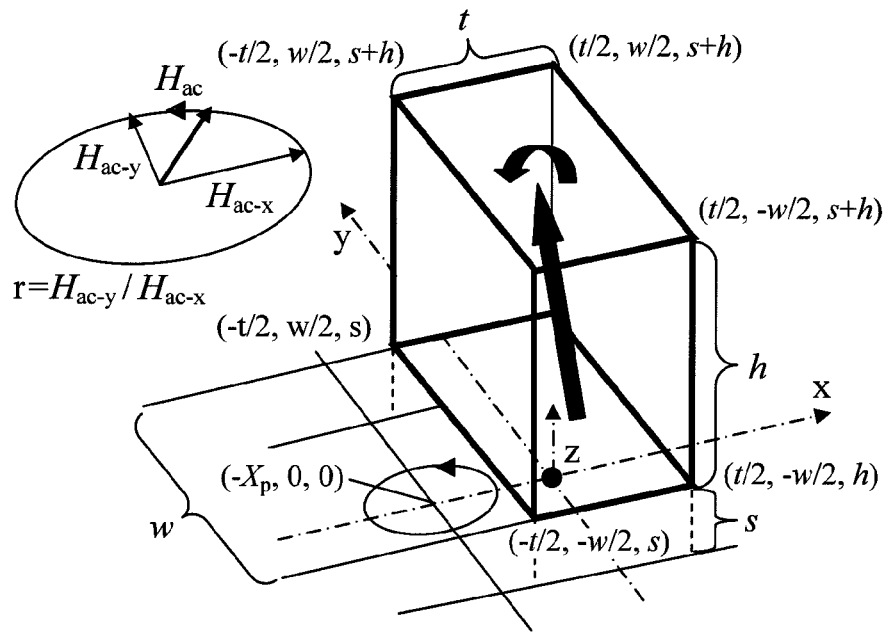
FIG. 1 is a diagram showing a summary of a magnetic field generated from an FGL.

FIG. 1 shows an example of a magnetic field generated from an FGL. The surrounding magnetic field is analyzed by assuming that in the magnetic field from the FGL, the magnetization is uniform inside the FGL, and the magnetization is generated at an end surface perpendicular to the magnetization rotation surface. A magnetic field (A/m) to the origin from rectangle surface elements $\{(x_1, y_1, z_0), (x_1, y_2, z_0), (x_2, y_1, z_0), (x_2, y_2, z_0)\}$ of a magnetization M (A/m) is provided by the following Expression (1)

$$H_x = -M \log\left(\frac{(y_1 + R_{21})(y_2 + R_{12})}{(y_1 + R_{11})(y_2 + R_{22})}\right) \quad (1)$$

$$H_y = -M \log\left(\frac{(x_1 + R_{12})(x_2 + R_{21})}{(x_1 + R_{11})(x_2 + R_{22})}\right)$$

$$H_z = -M\left(\tan^{-1}\left(\frac{x_1 y_1}{z_0 R_{11}}\right) + \tan^{-1}\left(\frac{x_2 y_2}{z_0 R_{22}}\right) - \tan^{-1}\left(\frac{x_1 y_2}{z_0 R_{12}}\right) - \tan^{-1}\left(\frac{x_2 y_1}{z_0 R_{21}}\right)\right)$$

There is no x direction component in the rotation of a high-frequency oscillation magnetic field at the origin of FIG. 1, and the rotation is in a plane y-z. Therefore, considering that effective components of switching of a magnetic material including a magnetization easy axis in the z axis direction are only high-frequency oscillation magnetic field components in the y direction, it can be considered that the high-frequency oscillation magnetic field at the origin is substantially a linear polarized field. Since the magnetic field in the magnetization direction does not provide torque to the magnetization, the magnetic field does not exert an effect on the magnetization. The "linear polarized field" used in the present invention is defined as a condition that the oscillation direction of the high-frequency oscillation magnetic field does not temporally change. The "substantially linear polarized field" is defined as a condition that the oscillation direction does not temporally change if the oscillation magnetic field components in the magnetization direction are ignored when the magnetization direction of the magnetic material to be switched is taken into account as described above. If there is a magnetic material to be switched in the present specification, "substantially" is omitted in the description.

$R_{11}$, $R_{12}$, $R_{21}$, and $R_{22}$ denote distances from the origin to vertices of the rectangle. Contributions from the surfaces of the FGL are weighted and added in the magnetization direction of the FGL to calculate the magnetic field distribution generated by the FGL and the time change. The FGL field can be substantially assumed to be a linear polarized field if the write track width is wide, and only the magnetic field from the air bearing surface needs to be considered.

Meanwhile, if a width w of the FGL is reduced for the reduction in the track pitch along with the increase in the areal recording density, the effect of the magnetic field from the side of the FGL cannot be ignored, and the FGL field becomes an elliptically-polarized field. To calculate the magnetic field from the side of the FGL, the z axis and the y axis can be converted to reread Expression (1) and related expressions. The "elliptically-polarized field" used in the present invention is a condition that the oscillation direction and the size of the high-frequency oscillation magnetic field temporally change, and the trajectory of the field vector forms an ellipse.

In this case, the direction and the size of the FGL field change over time in synchronization with the rotation of the magnetization of the FGL. Therefore, the trajectory of the field vector forms an ellipse and shows a behavior like precession. To obtain a magnetic field to a point different from the origin, such as a magnetic field to a point $(-X_p, 0, 0)$ of FIG. 1, the surface elements of Expression (1) can be moved by $X_p$ in the x axis direction to calculate the magnetic field to the origin. An ellipticity r is defined as a ratio of a minor axis to a major axis ($H_{ac-y}/H_{ac-x}$). The sign indicates positive in the counterclockwise rotation and negative in the opposite rotation (clockwise). Although the field components in the z direction also temporally change, the components are ignored by assuming that the oscillation magnetic field components parallel to the magnetization do not contribute to the switching. This is because the magnetic field in the magnetization direction does not provide torque to the magnetization, and there is no action to the magnetization.

As described, as a result of the field analysis based on Expression (1), it is found out that the trajectory of the field vector gradually gets close to a circle from an ellipse as the length in the write track width direction of the FGL is reduced in the high-frequency field generated at the position of formation of the recording bit.

Consequently, a computer simulation is performed using an LLG (Landau Lifschitz Gilbert) equation to examine the influence of the elliptically-polarized field on the magnetization switching-assisted effect of the magnetic material, and the following five points are found.
(1) The oscillation magnetic field components perpendicular to the magnetization to be switched (in-plane oscillation magnetic field components in the perpendicular magnetization medium) contribute to the switching.
(2) The elliptically-polarized field in the same rotation direction as the precession of the magnetization to be switched has an effect of assisting the magnetization switching, while the elliptically-polarized field rotated in the direct opposite the precession of the magnetization has an effect of restoring the magnetization once switched.
(3) A value of one-half of the sum of the major axis and the minor axis (in the case of the same rotation direction) of the elliptically-polarized field or one-half of the major axis minus the minor axis (opposite rotation) is a switching-assisted effective magnetic AC field.
(4) When the switching-assisted magnetic AC fields are the same, average values of external magnetic fields, in which the magnetization of the magnetic particles switches, are equal.
(5) Even if the switching-assisted effective magnetic AC fields are the same, the greater the ellipticity r (ratio of the minor axis to the major axis, negative value in the case of the opposite rotation), the smaller the variations in the magnetic fields in which the magnetization of the magnetic particles switches. An excellent magnetization switching pattern can be obtained.

For the calculation, it is considered that the magnetic particles with uniaxial magnetic anisotropy switch in accordance with a single domain model, and the behavior of the magnetization M is calculated using the following LLG equation.

$$(1+\alpha^2)\frac{d\vec{M}}{dt} = -\gamma(\vec{M}\times\vec{H}'), \vec{H}' = \vec{H} + \alpha\frac{\vec{M}\times\vec{H}}{M} \quad (2)$$

Here, $\gamma$ denotes a gyromagnetic constant, and $\alpha$ denotes a damping factor. An effective magnetic field H is constituted by a sum of four components, a magnetic anisotropy effective field $H_a$ ($=H_k \cos\theta_m$, $\theta_m$ is an angle formed by the magnetization and the magnetization easy axis), a static magnetic field $H_d$, an external magnetic field $H_{ext}$, and a high-frequency field $H_{ac}$. The static magnetic field $H_d$ considered in the present examination is a static magnetic field formed by the calculated magnetic particles, and the effect of adjacent particles and the like actually needs to be considered. The external magnetic field $H_{ext}$ is a magnetic field applied to the magnetic material from outside the magnetic material.

Figure 2:
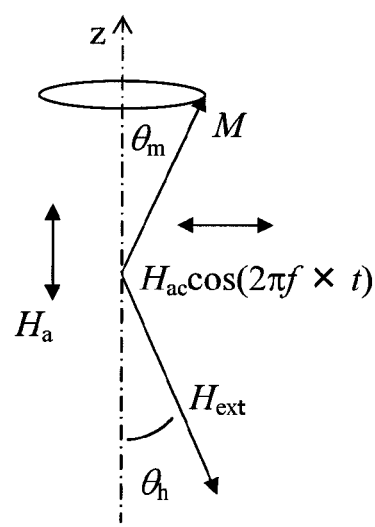
FIG. 2 is a diagram showing an application direction of an effective magnetic field of a simulation model.

FIG. 2 shows application directions of the effective magnetic fields. The vertical direction serves as the z direction, and $H_a$ is applied. $H_{ext}$ is opposite the initial magnetization direction and is applied in a direction inclined by $\theta_h$ from the vertical direction. The magnetization switches while rotating around the z axis approximately from a +z direction to a −z direction. Although only the horizontal direction is illustrated as the application direction of the high-frequency $H_{ac}$ in FIG. 2, a linear polarized field in a z-$H_{ext}$ plane, a linear polarized field perpendicular to the z-$H_{ext}$ plane, and an elliptically-polarized field in a plane perpendicular to the z axis are examined. The determination of the magnetization switching is statistically handled by dispersing 1024 isolated magnetic particles ($H_k$ dispersion 5% and angular dispersion 3 degrees).

Figure 3:
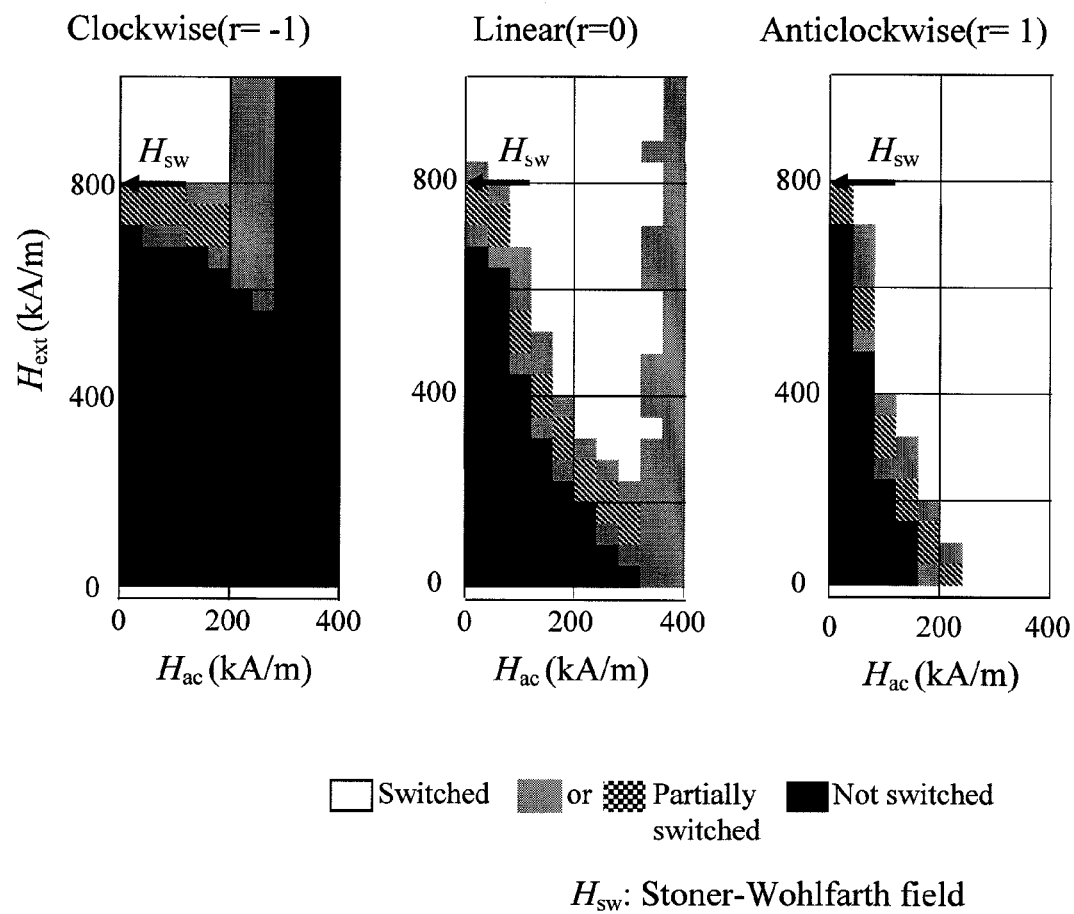
FIG. 3 is a diagram of a simulation result showing a change in the state of magnetization switching of a recording medium based on a direction of precession of a high-frequency field (clockwise oscillation magnetic field, one-way oscillation magnetic field, and counterclockwise oscillation magnetic field).

FIG. 3 shows a simulation result showing behaviors of the magnetization switching when the magnetic field $H_{ext}$ and the high-frequency field $H_{ac}$ from the main pole are applied to the set of 1024 isolated magnetic particles in which the magnetization easy axis faces the perpendicular direction relative to the film surface. The applied high-frequency field $H_{ac}$ is, from the left, a clockwise oscillation magnetic field (ellipticity r=−1), a linear polarized field oscillation magnetic field (r=0), and a counterclockwise oscillation magnetic field (r=1). In FIG. 3, □ denotes a state that the magnetization switching is completed within 3 ns (more than 95% of 1024 particles are switched), ■ denotes a state that the magnetization is not switched (more than 95% of 1024 particles are not switched), and the intermediate color denotes a state that the particles are partially switched. It can be recognized from FIG. 3 that there is no switching at all in the clockwise oscillation magnetic field components up to the Stoner-Wohlfarth field when the AC magnetic field is small, and there is no assisting effect. The Stoner-Wohlfarth field in FIG. 3 is a magnetic field in which the switching occurs just by the external magnetic field ($H_{ac}$=0) at 800 kA/m.

On the other hand, there is a phenomenon that the switching is inhibited in the clockwise oscillation magnetic field (r=−1) when the AC magnetic field is large even if a large external magnetic field that is sufficiently capable of switching alone is applied. This indicates that the clockwise oscillation magnetic field has an effect of promoting re-switching of the switched particles. The reason can be that the rotation direction of the magnetization of the switched particles is clockwise. This indicates that desired magnetization switching can be controlled in accordance with clockwise and counterclockwise rotations by providing a relatively large circular polarized high-frequency oscillation magnetic field regardless of the existence of the external magnetic field. If the linear polarized field oscillation magnetic field, the counterclockwise oscillation magnetic field, and the ellipticity are large, the external magnetic field subjected to magnetization switching is reduced with increase in the AC magnetic field. Therefore, the assisting effect can be confirmed. If the counterclockwise oscillation magnetic field is used, the same level of assisting effect can be obtained by about half the size of the oscillation magnetic field compared to when the linear polarized field oscillation magnetic field is used. The reason can be that the linear polarized field oscillation magnetic field can be dissolved into counterclockwise components and clockwise components as shown in the following expression.

$$H_{ac}\cos(2\pi f t) = \frac{H_{ac}}{2}((\cos(2\pi f t) + \sin(2\pi f t)) + (\cos(2\pi f t) - \sin(2\pi f t))) \quad (3)$$

It is contemplated that the counterclockwise components have an effect of generating magnetic resonance to assist the magnetization switching, because the AC magnetic field rotates in the same direction as the precession of the magnetization. The point that needs to be noted in using the linear polarized field oscillation magnetic field is that the effect of the re-switching by the clockwise oscillation magnetic field components becomes noticeable if the AC magnetic field is too large, and the magnetic recording cannot be performed. In FIG. 3, although an excellent magnetization switching pattern cannot be obtained if the AC magnetic intensity is over 300 kA/m, the re-switching may partially occur even with a lower AC magnetic intensity. There is no such a problem when the counterclockwise oscillation magnetic field (ellipticity r=1) is used.

Figure 4:
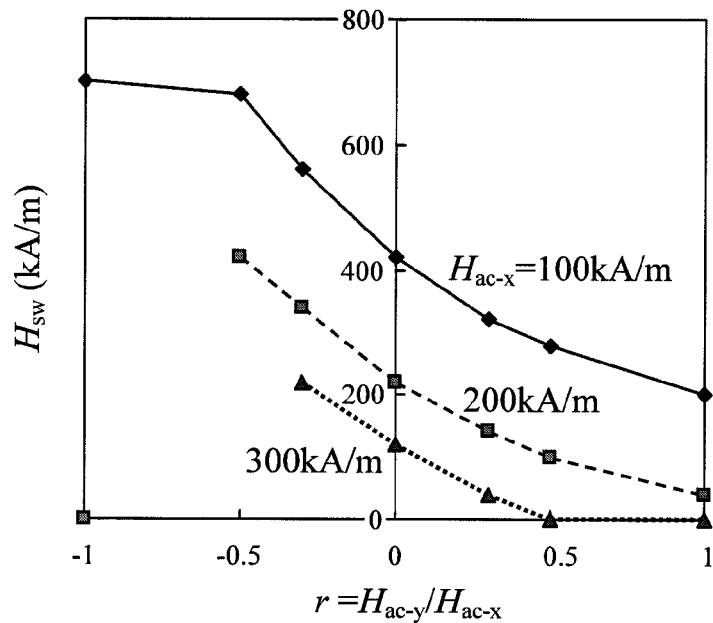
FIG. 4 is a diagram showing ellipticity dependency of a switching field.

FIG. 4 shows a switching field $H_{sw}$ relative to the ellipticity when the external magnetic field is applied to the magnetic material, in which the size of the magnetic anisotropy effective field is 1.6 MA/m, at 30 degrees from the magnetization easy axis ($\theta_h$=30 degrees). In the AC magnetic field, $H_{ac-x}$ components are fixed, and the size of orthogonal $H_{ac-y}$ is changed. $H_{ac-y}$ is positive in the counterclockwise elliptically-polarized field, and $H_{ac-y}$ is negative in the clockwise elliptically-polarized field. It can be recognized that the greater the $H_{ac-y}$ and the greater the $H_{ac-x}$, the smaller the $H_{sw}$, and a large assisting effect can be obtained. On the other hand, when $H_{ac-y}$ is negative, $H_{sw}$ is large even if the oscillation magnetic field components in the down track direction are the same. It can be recognized that the assisting effect of $H_{ac-y}$ is inhibited by the components. Therefore, on the assumption that switching is $$H_{ac-eff}=H_{ac-x}+H_{ac-y} \quad (4)$$

Figure 5:
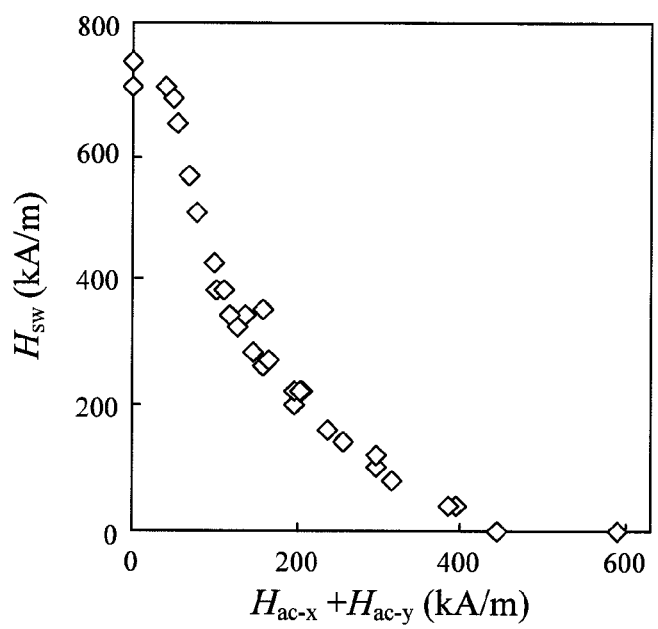
FIG. 5 is a diagram showing switching-assisted effective magnetic AC field dependency of the switching field.

FIG. 5 illustrates again the switching field $H_{sw}$ of FIG. 4 relative to $H_{ac-eff}$. From FIG. 5, the switching field $H_{sw}$ is substantially on the same curve in various combinations of the $H_{ac-x}$ components and the $H_{ac-y}$ components, and it can be considered effective to express the switching-assisted effective magnetic AC field by Expression (4).

In FIG. 3 and the like, when there is an assisting effect, magnetization switching is not gradually promoted when the AC magnetic intensity is increased while the external magnetic field is constant. There is the switch field $H_{ac-sw}$ in the same way as in the switching by the external magnetic field. More specifically, there is no switching when $H_{ac}$ is small, and the switching occurs when $H_{ac}$ is greater than the switch field $H_{ac-sw}$. The reason can be that the number of resonance oscillations significantly changes depending on the direction of the magnetization in the magnetic material with large magnetic anisotropy used in the magnetic recording, and the magnetization switching is not completed when the rotation of the magnetization and the oscillation magnetic field are synchronized (resonated) if the oscillation magnetic field is weak.

Figure 6:
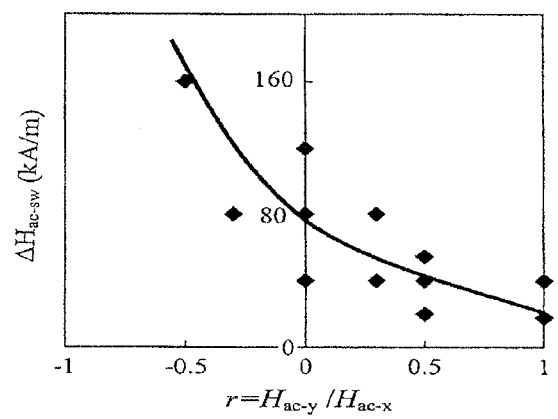
FIG. 6 is a diagram showing ellipticity dependency of a switched AC field width.

FIG. 6 shows a width $\Delta H_{ac-sw}$ of the switch AC magnetic field at plot points of FIG. 4 relative to the ellipticity. The greater the ellipticity, the smaller the width $\Delta H_{ac-sw}$, which indicates the possibility of forming an excellent switching magnetization pattern with large ellipticity even with the same switching-assisted effective magnetic AC field.

As described, to obtain an excellent recording pattern in the microwave assisted magnetic recording, it is important not only to enlarge the in-plane components of the high-frequency field intensity, but also to enlarge the ellipticity. Close attention to the direction of the magnetization rotation of the FGL is necessary in designing the FGL.

After detailed analysis of the magnetic field generated by the FGL, it is found out that the position where the switching-assisted effective magnetic AC field is the maximum (writepoint) and the position where the ellipticity is the maximum are different in the FGL, in which the shape of cross section perpendicular to the drive current of the high-frequency field generator is rectangular. It can be estimated that the magnetic field in the cross-track direction generated from the side of the FGL is insufficient around the end section on the main pole side of the FGL as the writepoint, compared to the magnetic field in the down track direction generated from the air bearing surface of the FGL.

Therefore, the FGL structure for strengthening the magnetic field from the FGL side is intensively studied so that the positions where the switching-assisted effective magnetic AC field and the ellipticity are the maximum coincide.

Figure 7:
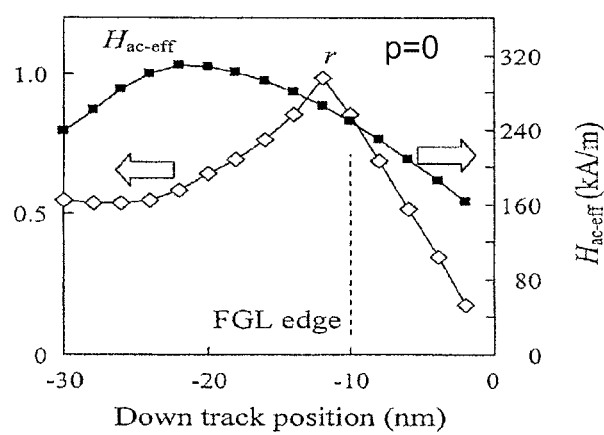
FIG. 7 is a diagram after examination of a condition of the magnetic field from the FGL in a conventional structure.

FIG. 7 shows the ellipticity in the down track direction and the switching-assisted effective magnetic AC field $H_{ac-eff}$ at the track center (y=0) of the magnetic field generated from the FGL under conditions w=40 nm, h=40 nm, t=20 nm, and s=10 nm (see FIG. 1). In the horizontal axis, directly below the FGL is 0, and values on the main pole side are negative values. The saturation magnetization of the FGL is 2.4 T. In FIG. 7, the position where the ellipticity is the maximum is 2 nm outside the edge of the FGL, while the position where $H_{ac-eff}$ is the maximum is 10 nm apart which is 12 nm outside the FGL edge. If the magnetic recording is performed at the point where $H_{ac-eff}$ is the maximum, the ellipticity is below 0.6. Therefore, sufficient writing may not be performed. This is because the possibility of the magnetization switching within a certain time significantly drops if the ellipticity at the point where $H_{ac-eff}$ is the maximum is less than 0.6.

To improve the ellipticity, the effect of the magnetic field from the side of the FGL needs to be reinforced to increase the cross-track direction components. Although the FGL field in the down track direction is reduced in some degree if a receded section is arranged on the FGL, the side of the FGL can be set close to the magnetic recording position. Therefore, the oscillation magnetic field components in the down track direction and the cross-track direction are substantially equal, and circular polarized field can be formed. The "circular polarized field" used in the present invention is a condition in which the size of the high-frequency oscillation magnetic field does not change but the oscillation direction temporally changes, and the trajectory of the field vector substantially forms a circle. However, the oscillation magnetic field components in the magnetization (easy axis) direction of the magnetic material to be switched are ignored.

Another example of the method for matching the positions where the switching-assisted effective magnetic AC field and the ellipticity are the maximum includes a method in which the shape of the cross section perpendicular to the electric current flowing through the FGL is a vertically long rectangle with the side closer to the air bearing surface being shorter (w<h in FIG. 1). However, in the method, the shape magnetic anisotropy is generated in the direction of the fringing field from the main pole. Therefore, the FGL tends to be fixed in the direction, and there is a problem that the oscillation frequency may change, or the oscillation may not occur. To calculate the magnetic field from an oblique side of the FGL, the coordinates can be appropriately converted to reread Expression (1) and related expressions.

Figure 8A:
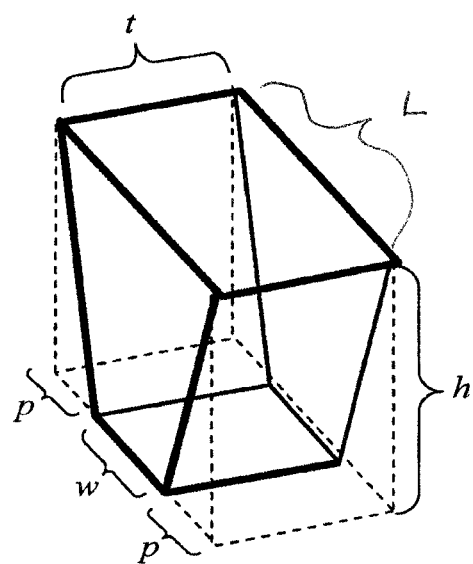
FIG. 8A is a diagram showing an example of a shape of the FGL including a receded section.
Figure 8B:
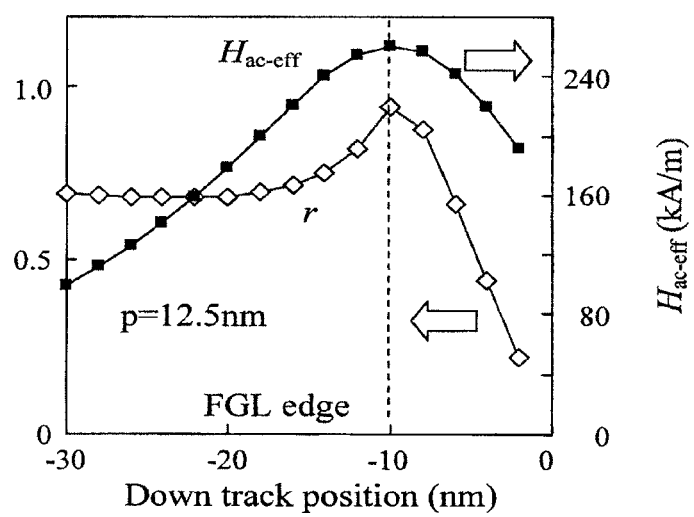
FIG. 8B is a diagram showing a change in a switching-assisted effective magnetic AC field, in which the FGL in the shape shown in FIG. 8A is generated, relative to a write track length direction position and a change in the ellipticity relative to the write track length direction position.

The ellipticity and the switching-assisted effective magnetic AC field $H_{ac\text{-}eff}$ are calculated for the FGL including the receded section from the air bearing surface at the end section in the write track width direction of the bottom surface, specifically the FGL in which the shape of the cross section perpendicular to the electric current flowing through the FGL shown in FIG. 8A is an inverted trapezoid including an upper side closer to the air bearing surface. FIG. 8A shows an FGL with a height "h", a width "w", a longer width "L" equal to "w" plus two times "p", and a thickness "t" that is perpendicular to all of "h", "w", and "L". FIG. 8B shows the calculation result. The position where the ellipticity is the maximum and the position where $H_{ac\text{-}eff}$ is the maximum coincide near the FGL edge, and excellent writing can be expected. However, the maximum value of the switching assisted effective magnetic AC field is 260 kA/m, which is a value 15% smaller than the maximum value 310 kA/m of the switching-assisted effective magnetic AC field of FIG. 7. This may be affected by the reduction in the generated magnetic field after the reduction in the area of the air bearing surface of the FGL.

Figure 8C:
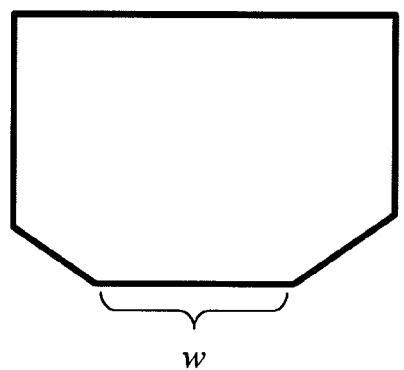
FIG. 8C is a diagram showing the FGL provided with a tapered section as the receded section on the air bearing surface side.
Figure 8D:
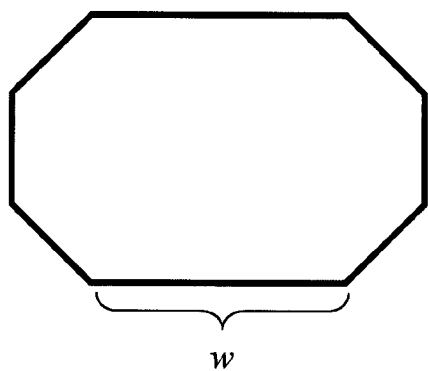
FIG. 8D is a diagram showing the FGL also provided with a tapered section on the upper surface side in addition to the tapered section on the air bearing surface side.
Figure 8E:
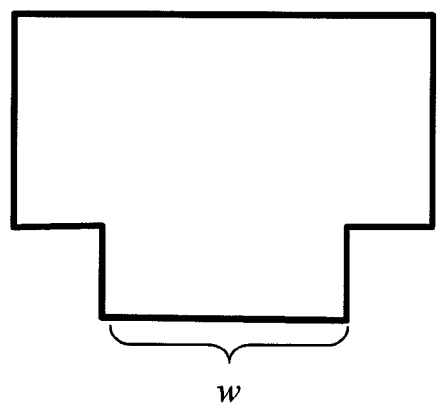
FIG. 8E is a diagram showing the FGL provided with a stepped section as the receded section on the air bearing surface side.

FIGS. 8C and 8D show FGLs in shapes including tapered sections as the receded sections formed on the air bearing surface side, and FIG. 8E shows an FGL in a shape including a stepped section as the receded section formed on the air bearing surface side. If the shape of the cross section perpendicular to the electric current flowing through the FGL has a structure shown in FIGS. 8C, 8D, and 8E, the reduction in the switching-assisted effective magnetic AC field can be controlled to about 7%. Particularly, in the structure of FIG. 8D, a tapered section is formed on the upper surface side in addition to a tapered section on the air bearing surface side. Therefore, there is almost no difference in the easiness of magnetization in the magnetization rotation surface of the FGL. Thus, smooth and fast magnetization rotations can be expected. FIG. 8E shows an FGL in a shape including a stepped section as the receded section formed on the air bearing surface side. In the FGL with the shape, the width of a size w that determines the write track width does not change during a wrapping process from the air bearing surface. Therefore, highly reliable head manufacturing is possible.

FIGS. 9A to 9F show examples of configuration of the FGL in shapes different from FIGS. 8A and 8C to 8E. Usually, the FGL is placed between the main pole and the opposing pole, and a drive current for generating a high-frequency field flows in from the main pole side or the opposing pole side. As the FGL in a different shape in which the cross-sectional area on the main pole side is smaller than the cross-sectional area on the opposing pole side is used as shown in FIGS. 9A to 9F, the peak positions of the ellipticity and the switching-assisted effective magnetic AC field can be set closer to the main pole. The cross-sectional area denotes a cross-sectional area in the laminate direction of the multilayer constituting the FGL.

Figure 9A:
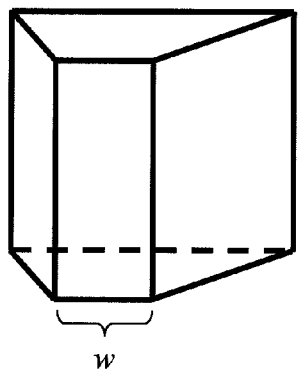
FIG. 9A is a diagram showing an example of the FGL of a shape in which the cross-sectional area on the main pole side is smaller than the cross-sectional area on the opposing pole side.
Figure 9B:
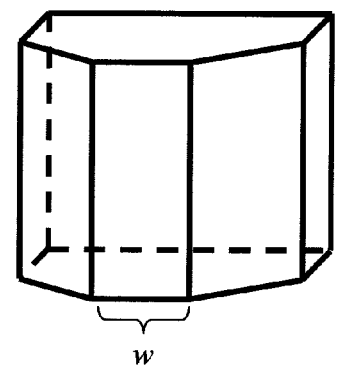
FIG. 9B is a diagram showing an example of the FGL of a shape in which the cross-sectional area on the main pole side is smaller than the cross-sectional area on the opposing pole side.

FIGS. 9A and 9B show FGLs with structures in which the tapered section from the opposing pole side to the main pole side forms the difference in the cross-sectional area (therefore, a structure in which the shape as seen from the upper surface and the air bearing surface has a tapered shape toward the write track width direction). As the FGL with such a structure is used, the peak positions of the ellipticity and the switching-assisted effective magnetic AC field can be set closer to the main pole, and a larger external (main pole) magnetic field can be used. Particularly, in the structure of FIG. 9B, the reduction in the maximum value of the switching-assisted effective magnetic AC field is about 5%, and the control effect of the reduction in the switching-assisted effective magnetic AC field is greater than the FGLs with the structures shown in FIGS. 8A and 8C to 8E. In the FGL structures of FIGS. 9A and 9B, the difference in the oscillation property based on termination timing of the wrapping process from the air bearing surface side is not significantly high.

Figure 9C:
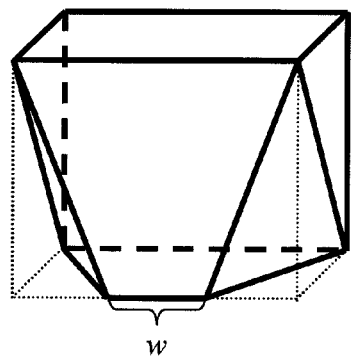
FIG. 9C is a diagram showing an example of the FGL of a shape in which the cross-sectional area on the main pole side is smaller than the cross-sectional area on the opposing pole side.
Figure 9D:
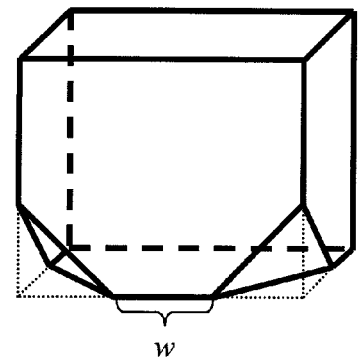
FIG. 9D is a diagram showing an example of the FGL of a shape in which the cross-sectional area on the main pole side is smaller than the cross-sectional area on the opposing pole side.

FIGS. 9C and 9D show FGLs with structures provided with deletion sections of vertex angles after cutting two vertex angles on the air bearing surface side among four vertex angles on the main pole side in the FGLs in the rectangular solid shape shown in FIG. 1. In the FGL with such a structure, the peak positions of the ellipticity and the switching-assisted effective magnetic AC field almost completely match, and it is contemplated that there is almost no attenuation of the magnetic field. However, manufacturing is difficult. The structures of FIGS. 9C and 9D that project to the main pole side can also be considered.

Figure 9E:
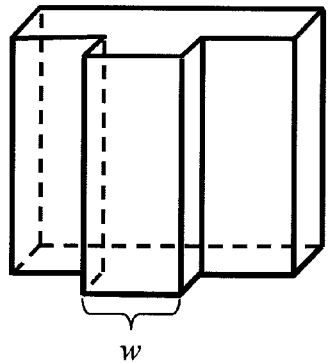
FIG. 9E is a diagram showing an example of the FGL of a shape in which the cross-sectional area on the main pole side is smaller than the cross-sectional area on the opposing pole side.
Figure 9F:
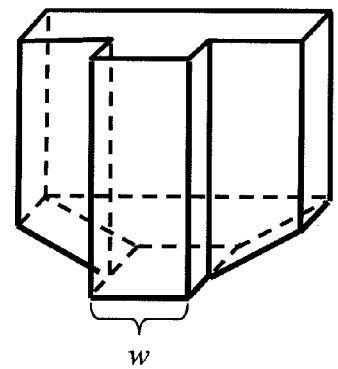
FIG. 9F is a diagram showing an example of the FGL of a shape in which the cross-sectional area on the main pole side is smaller than the cross-sectional area on the opposing pole side.

FIGS. 9E and 9F show FGLs with structures that realize the difference in the cross-sectional area between the main pole side and the opposing pole side by providing stepped structures on the main pole side (therefore, structures in which the shapes as seen from the upper surface and the air bearing surface form convex shapes). In the FGL shown in FIG. 9F, a tapered section in the height direction is included on the air bearing surface side in addition to a stepped structure on the main pole side. The structures shown in FIGS. 9E and 9F have advantages that the peak positions of the ellipticity and the switching-assisted effective magnetic AC field can be matched and that the manufacture is easier than the FGL with the structures shown in FIGS. 9C and 9D. This is because the mask pattern used in the lithography needs to be changed just once to manufacture the FGLs with the structures of FIGS. 9E and 9F.

To match the positions where the switching-assisted effective magnetic AC field and the ellipticity are the maximum, the shape of cross section of the FGL may be, for example, a vertically long rectangle in which a side on the air bearing surface side is shorter than a side closer to the FGL, in addition to the FGLs with the structures shown in FIGS. 8A, 8C to 8E, and 9A to 9F. However, the shape magnetic anisotropy is generated in the direction of the fringing field from the main pole. Therefore, the FGL tends to be fixed in the direction, and there is a problem that the oscillation frequency may change, or the oscillation may not occur. Meanwhile, in the structures shown in FIGS. 8C, 8D, 8E, and 9A to 9F, the shape of the cross section has a horizontally long shape on average. Therefore, the shape magnetic anisotropy is generated in the orthogonal direction of the fringing field from the main pole, and the in-plane magnetization rotation of the FGL is smooth.

The FGL shapes shown in FIGS. 9A to 9F are particularly effective in improving the SN ratio because there is less magnetic recording degaussing (phenomenon of erasing the previous bit upon magnetic recording of the next bit) in the FGL shapes shown in FIGS. 9A and 9B.

According to the configuration, the position where the switching-assisted effective magnetic AC field is the maximum (writepoint) and the position where the ellipticity is the maximum can be approximately matched. Therefore, the transition width between adjacent bits recorded in the continuous medium or DTM can be steepened, and the probability that the switching cannot be performed in the BPM can be controlled. As a result, a high-reliable high-areal-recording-density information recording device can be provided. According to the configuration, the distribution of the switching-assisted effective magnetic AC field in the write tack width direction is also steepened, and the track density can be increased based on a combination with a highly accurate positioning mechanism. Therefore, an information recording device with a further increase in the areal recording density can be realized, which is significantly advantageous in terms of size, cost, and the like.

First Embodiment

Figure 10A:
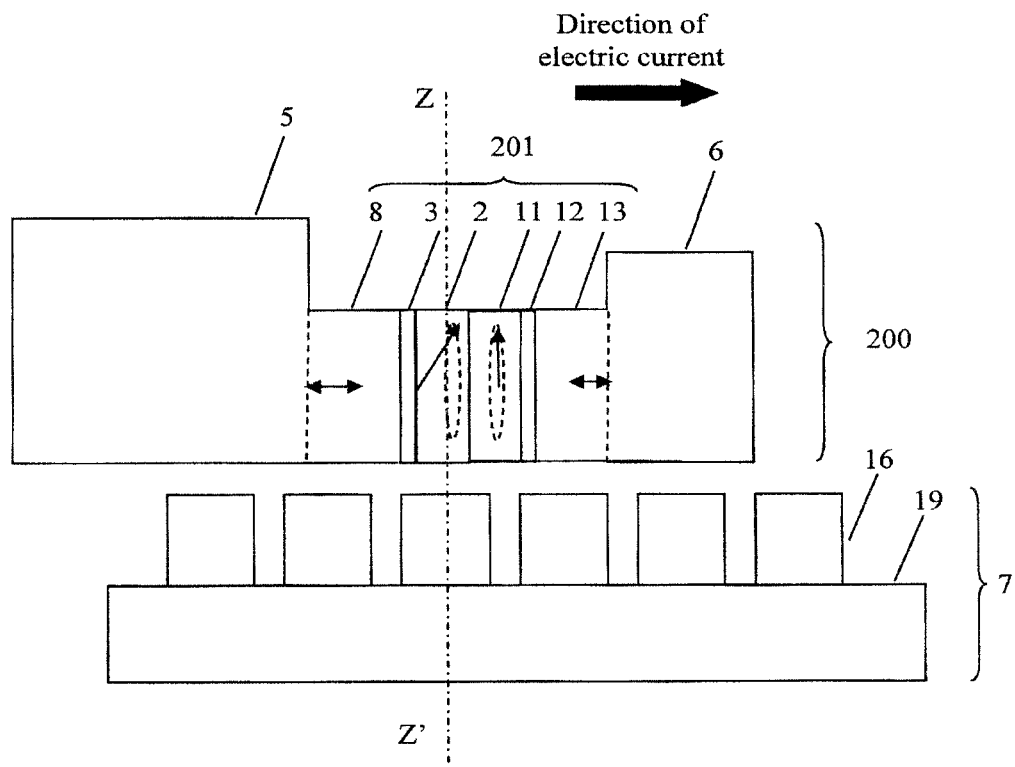
FIG. 10A is a schematic diagram of a cross section depicting a write head and a recording medium of a first embodiment from a write track width direction.

FIG. 10A shows a cross-sectional structure around a magnetic recording mechanism when a write head and a recording medium are cut at a plane perpendicular to a recording medium surface (up and down direction in FIG. 10A) and parallel to a direction of head running (track direction in left or right direction of FIG. 10A). A write head 200 forms a magnetic circuit on the upper side of FIG. 10A (FIGS. 10D and 10G-a to 10G-d) between a main pole 5 and an opposing pole 6. However, the upper side of FIG. 10A is substantially electrically insulated. A magnetic line of force forms a closed circuit, and the magnetic circuit does not have to be formed only by magnetic materials. An auxiliary pole or the like may be arranged on the opposite side of the opposing pole 6 of the main pole 5 to form the magnetic circuit. In that case, the main pole 5 and the auxiliary pole do not have to be electrically insulated.

The write head 200 further includes a coil, a copper wire, and the like for exciting the magnetic circuits. The main pole 5 and the opposing pole 6 include electrodes or means for electrically contacting the electrodes, and a high-frequency excitation current from the main pole 5 side to the opposing pole 6 side, or vice versa, can be applied through an FGL 2. The material of the main pole 5 and the opposing pole 6 is a CoFe alloy with large saturation magnetization and with almost no magnetic crystalline anisotropy. To reduce the fringing field to the FGL 2 (FGL in-plane direction components) to increase the high frequency, the auxiliary pole arranged on the opposite side of the opposing pole 6 of the main pole 5 can be set a little closer to the main pole 5 side.

Figure 10B:
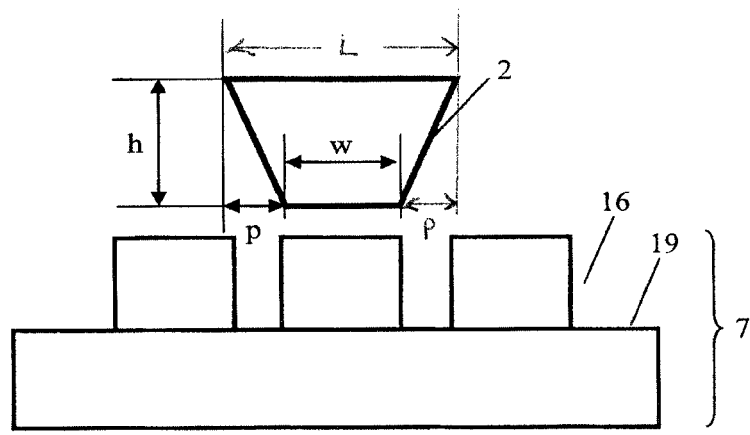
FIG. 10B is a cross-sectional view depicting the schematic diagram shown in FIG. 10A from a direction after cutting at a segment Z-Z'.
Figure 10C:
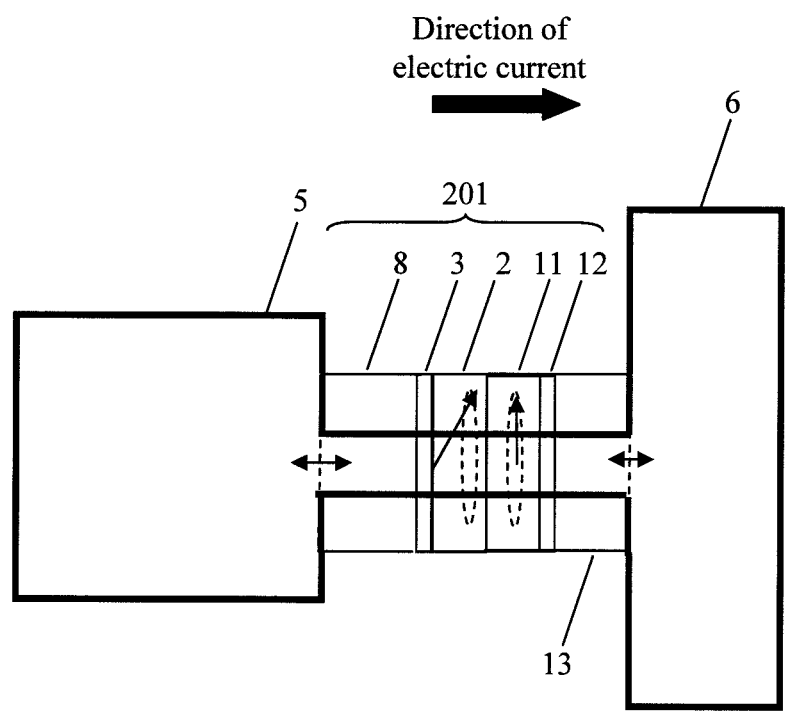
FIG. 10C is a schematic diagram depicting the schematic diagram shown in FIG. 10A from the upper surface (surface opposite the air bearing surface).

Adjacent to the main pole 5, a lip 8, a metal non-magnetic spin conduction layer 3, the FGL (magnetization fast rotating body) 2, a negative perpendicular magnetic anisotropy body 11, a metal non-magnetic spin scatterer 12, and an opposing pole lip 13 are arranged in layers through to the opposing pole 6. From the lip 8 to the opposing pole lip 13 have a columnar structure extending in the horizontal direction on FIG. 10A, and the cross section is a trapezoid in which the side along the air bearing surface is shorter than the opposing side (see FIG. 10B). The trapezoid shape allows matching the peak positions of the ellipticity of the FGL magnetic field and the switching-assisted effective magnetic AC field, and an excellent writing property can be expected. A width "w" of the side along the trapezoid air bearing surface is an important factor for determining the write track width and is 15 nm in the present embodiment. FIG. 10B shows a height "h", a width "w", a longer width "L" equal to "w" plus two times "p". In the microwave assisted magnetic recording, a recording medium with large magnetic anisotropy is used which does not allow magnetic recording unless the write magnetic field from the main pole 5 and the high-frequency field from the FGL 2 match. Therefore, the width and the thickness (thickness in the direction of head running) of the main pole 5 can be set larger so that the write magnetic field can be large (FIG. 10C). In the present embodiment, the width is 80 m, and the thickness is 100 nm. A write magnetic field of about 0.9 MA/m can be obtained.

A material with the same or greater saturation magnetization than the main pole 5 is used for the lip 8, and a 3D field simulator is used to design the thickness of the lip 8 so that the magnetic field from the main pole 5 is perpendicular to the layer direction of the FGL 2 as much as possible. In the present embodiment, a (Co/Ni)$_n$ artificial lattice film with relatively weak perpendicular magnetic anisotropy is used as the lip 8 touching the metal non-magnetic spin conduction layer 3. Although the thickness of the lip 8 in the present embodiment is 10 nm, the value depends on the shape of the trapezoid, the distance to the opposing pole and the condition, the condition of the medium used, and the condition of the magnetic circuits on the upper side of the drawings. The FGL 2 is made of a CoFe alloy of 20 nm thickness with large saturation magnetization and with almost no magnetic crystalline anisotropy. In the FGL 2, the magnetization rapidly rotates in the plane along the layers, and the fringing field from the pole that emerges on the air bearing surface and the side acts as a high-frequency field.

The driving force of the magnetization rotation of the FGL 2 is spin torque based on the spin reflected to the lip 8 through the metal non-magnetic spin conduction layer 3. The spin torque acts in a direction in which the magnetization components parallel to the magnetization rotation axis of the FGL 2 generated by the fringing field from the main pole 5 are reduced. To obtain the action of the spin torque, a high-frequency excitation (direct current) electric current needs to flow from the main pole 5 side to the opposing pole 6 side. The direction of the electric current is from the metal non-magnetic spin conduction layer 3 side to the FGL 2 side. The rotation direction of the magnetization of the FGL 2 is counterclockwise as seen from the upstream of the high-frequency excitation (direction current) electric current when the magnetic field flows from the main pole 5, and a magnetic field rotating in the same direction as the direction of the precession of the magnetization of the recording medium that switches by the magnetic field from the main pole 5 can be applied.

The rotation direction of the magnetization of the FGL 2 is clockwise as seen from the upstream of the high-frequency excitation (direction current) electric current when the magnetic field flows into the main pole 5, and the magnetic field rotating in the same direction as the direction of the precession of the magnetization of the recording medium that switches in the magnetic field to the main pole 5 can be applied. Therefore, the circularly-polarized high-frequency field of the FGL 2 has an effect of assisting the magnetization switching by the main pole 5 regardless of the polarity of the main pole 5. In this regard, the direction of the spin torque is not changed by the polarity of the main pole 5 in the high-frequency field generator in a format described in Non Patent Literature 2, and the effect cannot be obtained.

The larger the high-frequency excitation current (electron flow), the greater the spin torque action. The spin torque action increases if about 1 nm CoFeB layer with large polarizability is inserted between the metal non-magnetic spin conduction layer 3 and an adjacent layer. Although 2 nm-Cu is used for the metal non-magnetic spin conduction layer 3, Ru or the like which is a metal non-magnetic material with high spin conductivity may be used. In the negative perpendicular magnetic anisotropy body 11, a c-axis direction of hexagonal CoIr is set in the horizontal direction in the drawings, and the size of the magnetic anisotropy is $6.0 \times 10^5$ J/m$^3$. As the magnetic material with negative perpendicular magnetic anisotropy is set adjacent to the FGL 2, an effect of retaining the magnetization direction of the FGL 2 in the perpendicular direction of the rotation axis is strengthened. The effect allows obtaining a strong oscillation magnetic field with a relatively low frequency. The same effect can be expected by α'-FeC, dhcp CoFe, NiAs-type MnSb, and the like that are known as magnetic materials with negative perpendicular magnetic anisotropy. Since the CoFe alloy is used for the FGL 2, there is large exchange coupling just like CoIr even if α'-FeC or dhcp CoFe is used, and an effect of retaining the magnetization direction in the perpendicular direction of the rotation axis increases. If the (Co/Fe)$_n$ artificial lattice film with negative perpendicular magnetic anisotropy is used for the FGL 2, the magnetization of about the same level as in the CoFe alloy can be obtained. Therefore, the magnetization rotation is stabilized without arranging the negative perpendicular magnetic anisotropy body 11, and an excellent oscillation property can be obtained. For the metal non-magnetic spin scatterer 12, 3 nm-Pt is used. There is a similar effect when Pd is used. For the opposing pole lip 13, a 15 nm CoFe alloy is used.

For the recording medium 7, a CoCrPt layer as the recording layer 16 with 10 nm thickness and 1.6 MA/m (20 kOe) magnetic anisotropy effective field is used on the substrate 19. After forming a continuous medium by sputtering, nanoimprint lithography is used to arrange and create a magnetic material pattern with 9 nm length in the track direction and 7 nm in the down track direction at 12.5 nm track pitch and 10.0 nm bit pitch.

A slider 102 including a recording reader 109 embedded with a high-frequency field generator 201 of the present embodiment is attached to a suspension 106 (FIGS. 10D to 10F) to constitute a head gimbal assembly. In a structure shown in 10E, the magnetic recording reader is arranged at a trailing section of the slider. In a structure shown in FIG. 10F, the magnetic recording reader is arranged at a leading section of the slider.

Figure 10D:
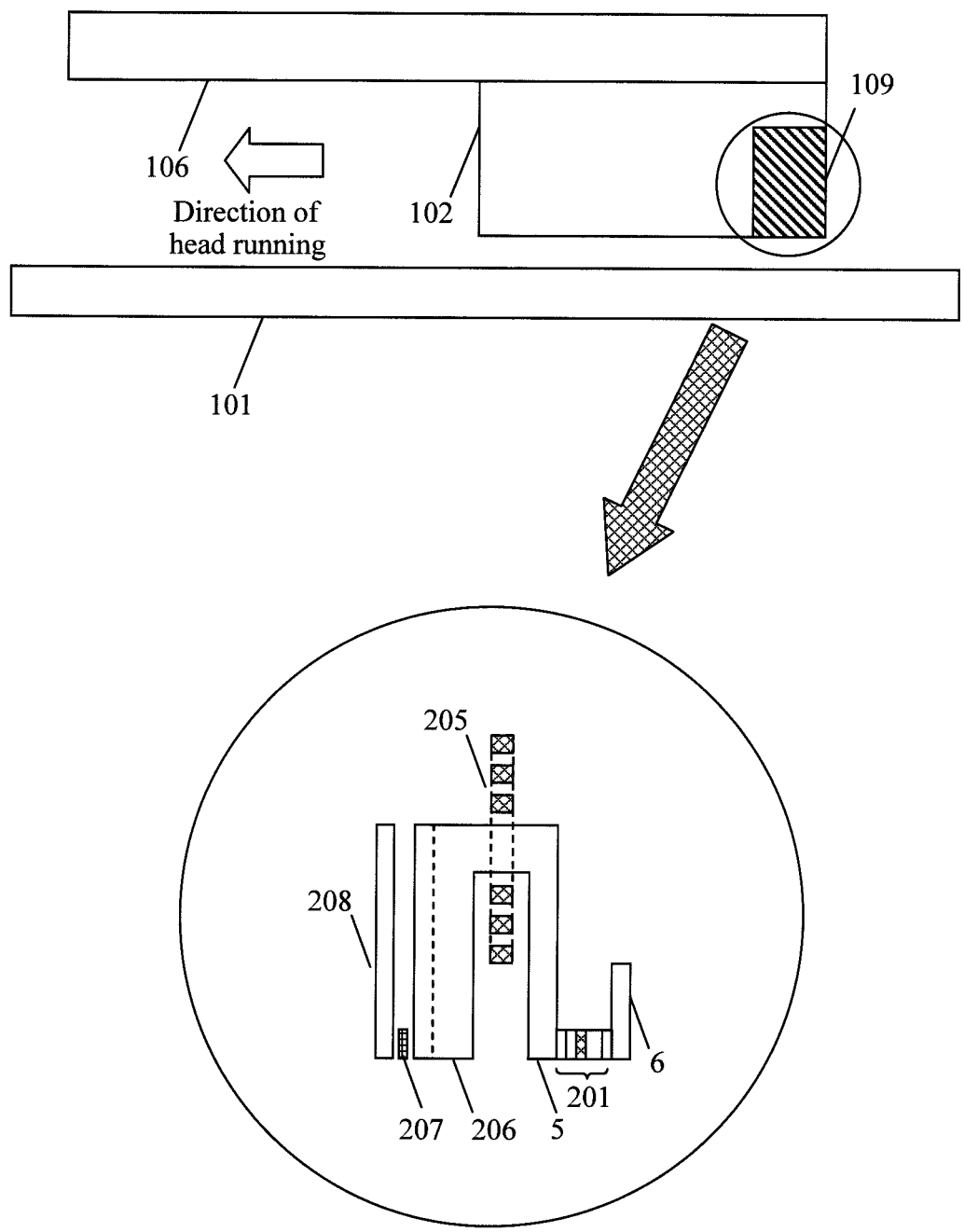
FIG. 10D is a diagram showing a slider including a write head and a magnetic recording reader shown in FIG. 10A.

FIGS. 10G-b to 10G-d show structures of the magnetic recording reader that can be considered in addition to the structure shown in FIG. 10D. FIG. 10G-a is a view of the structure of FIG. 10D from the opposite side. Therefore, in FIGS. 10G-a to 10G-d, the trailing side is defined as the left side of the drawings, and the leading side is defined as the right side of the drawings.

FIG. 10G-b shows an example of configuration different from FIG. 10G-a. In the magnetic head shown in FIG. 10G-b, the excitation coil of the main pole 5 is rolled not upward, but in the horizontal direction. In the magnetic head with the configuration, the excitation position is closer to the main pole air bearing surface compared to the structure of FIG. 10G-a. Therefore, a stronger magnetic flux can be generated from the main pole 5, compared to the structure shown in FIG. 10G-a.

FIG. 10G-c shows an example of configuration of the magnetic head for microwave assisted magnetic recording, in which the write head is arranged on the leading side, and the reader is arranged on the trailing side. In the magnetic head with the configuration shown in FIG. 10G-c, the main pole 5 is arranged at the leading end, and the opposing pole 6 is arranged closer to the trailing side relative to the main pole 5. Although the opposing pole 6 and a shield for sensor are shared in the magnetic head with the structure shown in FIG. 10G-c, the opposing pole 6 and the shield for sensor may be separated. It is the same as FIG. 10G-a that the order of lamination of the high-frequency generator 201 is opposite the order of lamination shown in FIG. 5. Although the winding direction of the excitation coil is upward rolling as in FIG. 10G-a, the winding direction may be horizontal rolling as shown in FIG. 10G-d.

Figure 10E:
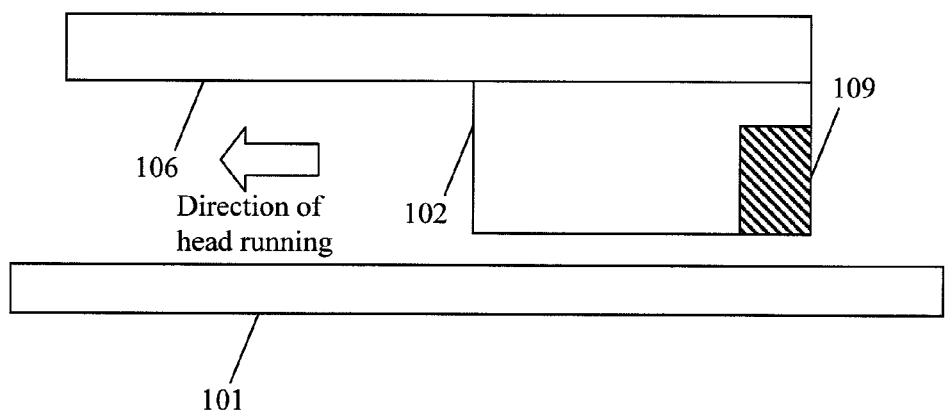
FIG. 10E is a schematic diagram showing a relationship between the slider and a direction of head running.
Figure 10F:
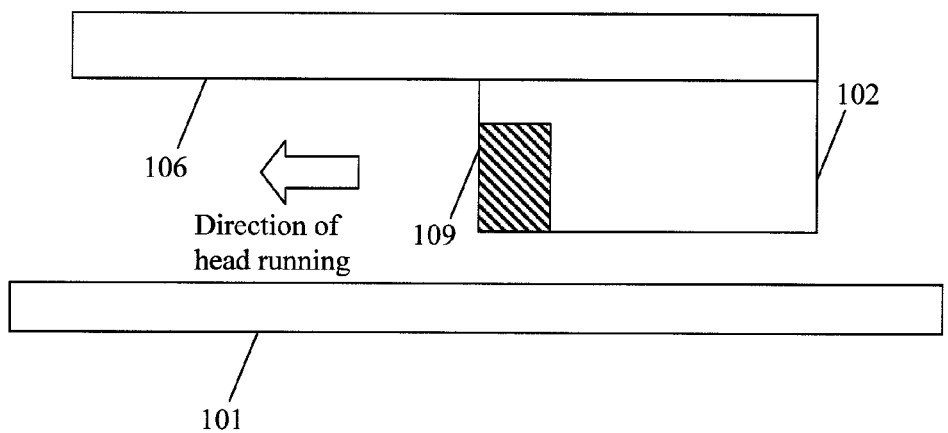
FIG. 10F is a schematic diagram showing a relationship between the slider and the direction of head running.

The write heads in the configurations shown in FIGS. 10G-a to 10G-d can be mounted on the magnetic head sliders in the structures of FIGS. 10E and 10F.

In the created magnetic head, a spinstand is used to measure the recording reading property. In the measurement, magnetic recording is performed based on relative velocity of 20 m/s between head and medium, 7 nm head-medium spacing, and 12.5 nm track pitch, and reading is further performed by a GMR head with 18 nm shield gap length. As a result of changing the high-frequency excitation current to measure the signal/noise ratio at 1250 kFCI, 13.0 dB is obtained at the maximum, and it is recognized that recording reading of areal recording density over 5 T bits per square inch can be sufficiently attained. The high frequency at this point is 35.0 GHz. If the head-medium spacing is set to 5 nm, the signal/noise ratio decreases from 14.0 dB to 9.0 dB when the cross section of the FGL 2 is a rectangle, while the signal/noise ratio increases to 15.0 dB when the shape of the cross section is an inverted trapezoid of the present invention.

Figure 13A:
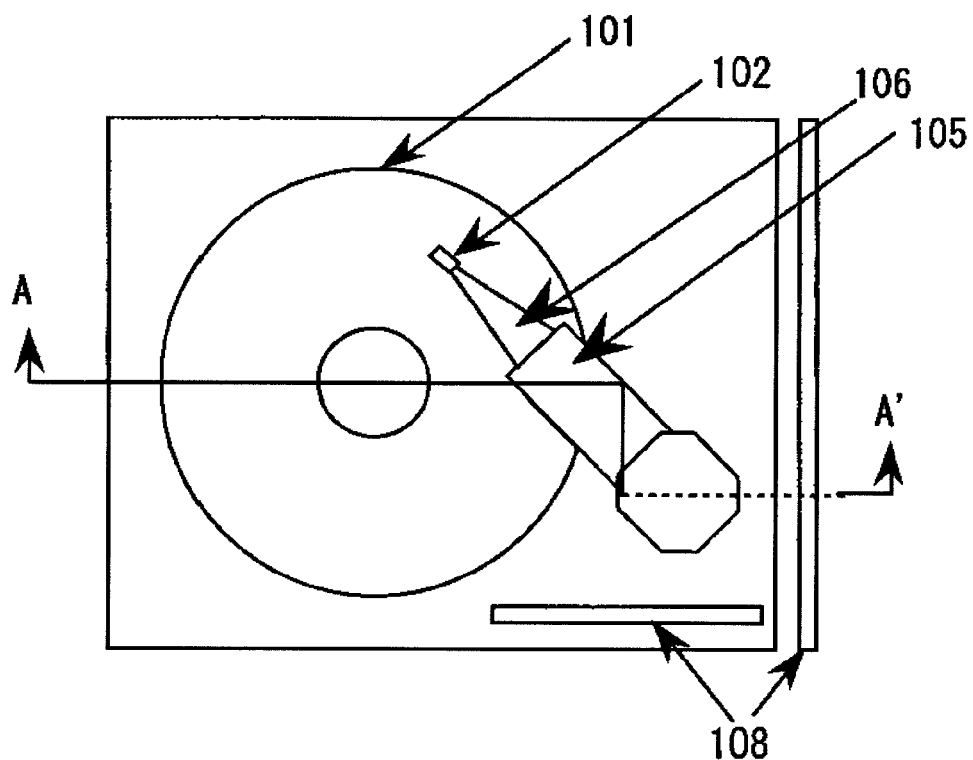
FIG. 13A is a plan view showing a basic configuration of a magnetic disk device according to the first to third embodiments.
Figure 13B:
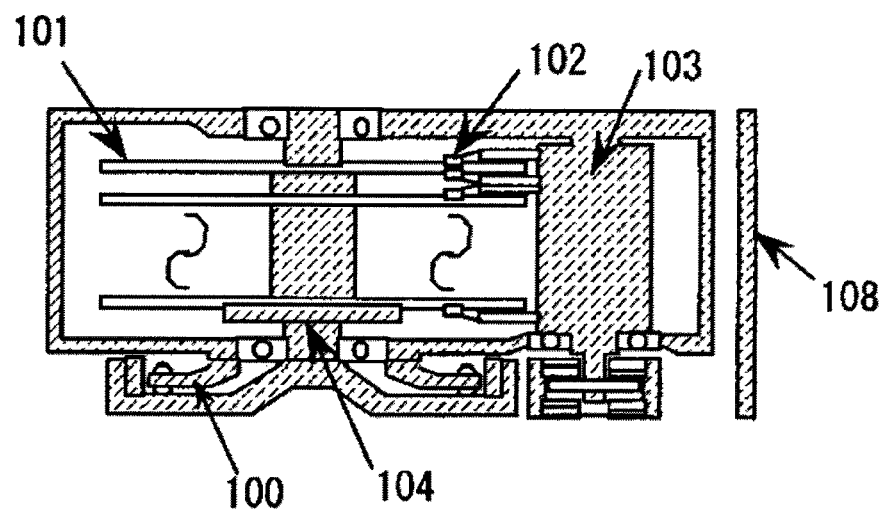
FIG. 13B is a cross-sectional view of A-A' of FIG. 13A.

The write head and the recording medium described above are incorporated into the magnetic disk device to evaluate the performance. FIGS. 13A and 13B show basic configurations of the magnetic disk device including the write head and the recording medium of the present embodiment. FIG. 13A is a plan view, and FIG. 13B is a cross-sectional view at A-A' of FIG. 13A. A recording medium 101 is fixed to a rotation bearing 104 and rotated by a motor 100.

Although FIG. 13B illustrates three magnetic disks and four magnetic heads in an example including five magnetic disks and ten magnetic heads, only one or more magnetic disks and one or more magnetic heads are required. The recording medium 101 is disc-shaped, and recording layers are formed on both sides of the recording medium 101. The slider 102 moves over the rotating recording medium surface in a substantially radial direction and includes a magnetic head at the end. The suspension 106 is supported by rotary actuator 103 through an arm 105. The suspension 106 has a function of pressing the slider 102 against the recording medium 101 at a predetermined load or pulls the slider 102 apart from the recording medium 101. A predetermined electric circuit is necessary to process a read signal and to input and output information. A signal processing circuit with an expanded PRML (Partial Response Maximum Likelihood) system actively utilizing the waveform interference during the density growth is attached to a casing 108 or the like.

The write head and the recording medium described above are incorporated into the magnetic disk device shown in FIGS. 13A and 13B to evaluate the performance. An information recording reading device utilizing a high-frequency rotating field of 2.5 T bytes (4 T bits per square inch) on each surface of 2.5-inch magnetic disks, or recording capacity of 5 T bytes in total, is obtained.

Second Embodiment

Figure 11A:
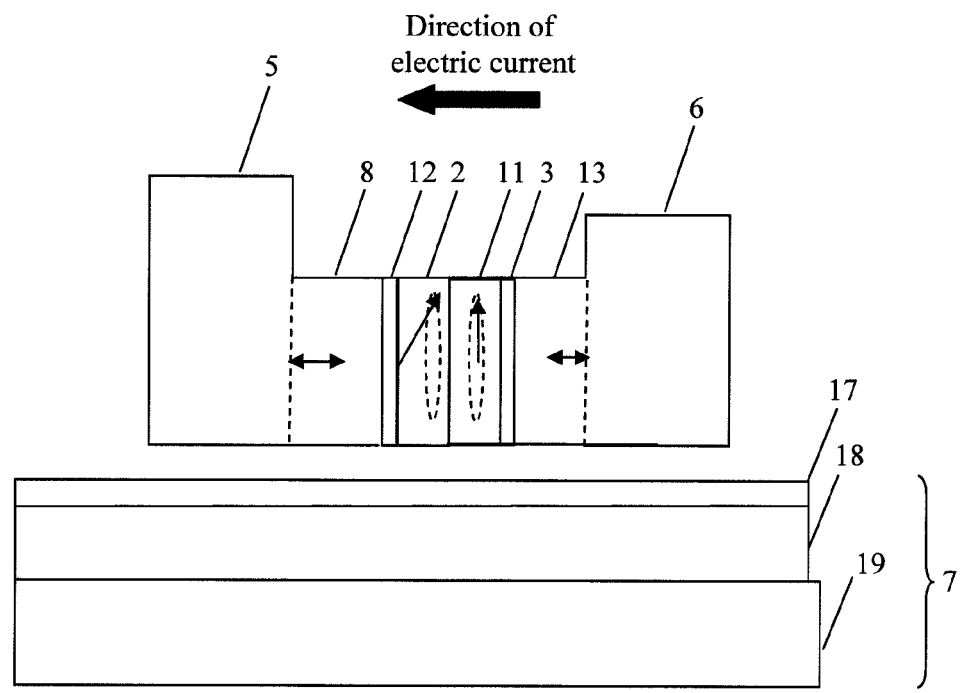
FIG. 11A is a schematic diagram of a cross section depicting the write head and the recording medium of a second embodiment from the write track width direction.
Figure 11B:
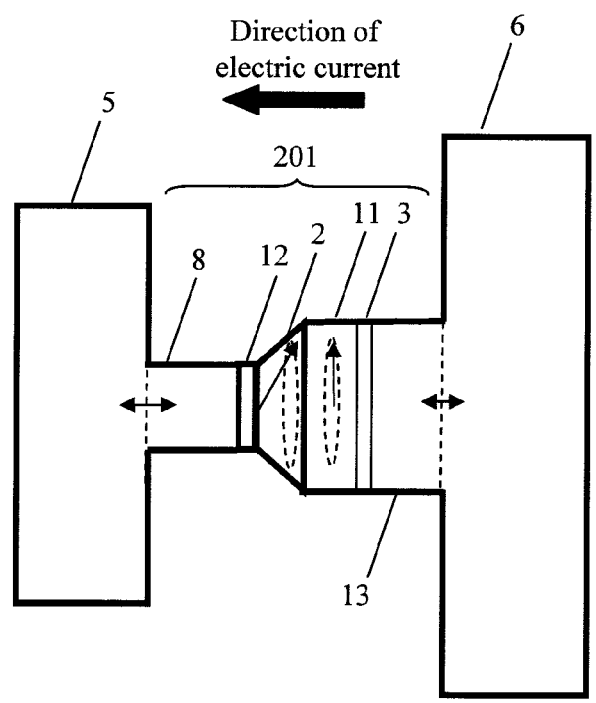
FIG. 11B is a schematic diagram depicting the schematic diagram shown in FIG. 11A from the upper surface (surface opposite the air bearing surface).

FIGS. 11A and 11B are diagrams showing a second example of configuration of the write head and the recording medium according to the present invention. The main pole 5, the opposing pole 6, and configurations on the upper and left sides of FIGS. 11A and 11B used in the present example of configuration are the same as in the first example of configuration.

Adjacent to the main pole 5, the lip 8, the metal non-magnetic spin scatterer 12, the FGL 2, the negative perpendicular magnetic anisotropy body 11, the metal non-magnetic spin conduction layer 3, and the opposing pole lip 13 are arranged in layers through to the opposing pole 6. From the lip 8 to the opposing pole lip 13 are columnar, and the cross section is a rectangle in which the direction along the air bearing surface is long. As a result of the rectangular shape, shape anisotropy is generated in the write track width direction. Therefore, the in-plane magnetization rotation of the FGL 2 can be smoothly performed even if there are in-plane components of the FGL 2 of the fringing field from the main pole, and the main pole 5 and the FGL 2 can be approximated. The magnetization of the FGL 2 is parallel to the air bearing surface when the state is not the oscillation state, and unnecessary magnetization switching and the like caused by the fringing field can be prevented. The shape of the air bearing surface of the FLG 2 is a trapezoid in which the main pole side is shorter, and the shape is columnar in the height direction. The length of the shorter side of the trapezoid is an important factor for determining the write track width and is 28 nm in the present embodiment.

In the microwave assisted magnetic recording, a recording medium with large magnetic anisotropy is used which does not allow magnetic recording unless the write magnetic field from the main pole 5 and the high-frequency field from the FGL 2 match. Therefore, the width and the thickness (length in the direction of head running) of the main pole 5 can be set larger so that the write magnetic field can be large. In the present embodiment, the width is 120 nm, and the thickness is 80 nm. A write magnetic field of about 0.8 MA/m can be obtained.

A material with the same or greater saturation magnetization than the main pole 5 is used for the lip 8, and a 3D field simulator is used to design the thickness of the lip 8 so that the magnetic field from the main pole 5 is perpendicular to the layer direction of the FGL 2. Although the thickness of the lip 8 in the present embodiment is 5 nm, the value depends on the shape of the rectangle, the distance to the opposing pole and the condition, the condition of the medium used, and the condition of the magnetic circuits on the upper side of the drawings. The FGL 2 is made of a CoFe alloy of 20 nm thickness with large saturation magnetization and with almost no magnetic crystalline anisotropy.

In the FGL 2, the magnetization rapidly rotates in the plane along the layers, and the fringing field from the pole that emerges on the air bearing surface acts as a high-frequency field. The driving force of the magnetization rotation of the FGL 2 is spin torque based on the spin reflected to opposing pole lip 13 through the metal non-magnetic spin conduction layer 3 and retained in the negative perpendicular magnetic anisotropy body 11. The spin torque acts in a direction in which the magnetization components parallel to the rotation axis of the FGL 2 generated by the fringing field from the main pole 5 are reduced. To obtain the action of the spin torque, a high-frequency excitation electric current needs to flow from the opposing pole 6 side to the main pole 5 side. The direction of the electric current is from the metal non-magnetic spin conduction layer 3 side to the FGL 2 side. The rotation direction of the magnetization of the FGL 2 is counterclockwise as seen from the downstream of the high-frequency excitation (direction current) electric current when the magnetic field flows from the main pole 5, and a magnetic field rotating in the same direction as the direction of the precession of the magnetization of the recording medium that switches by the magnetic field from the main pole 5 can be applied. The rotation direction of the magnetization of the FGL 2 is clockwise as seen from the downstream of the high-frequency excitation (direction current) electric current when the magnetic field flows into the main pole 5, and the magnetic field rotating in the same direction as the direction of the precession of the magnetization of the recording medium that switches in the magnetic field to the main pole 5 can be applied. Therefore, the circularly-polarized high-frequency field of the FGL 2 has an effect of assisting the magnetization switching by the main pole 5 regardless of the polarity of the main pole 5. As in the first embodiment, the direction of the spin torque is not changed by the polarity of the main pole 5 in the high-frequency field generator in a format described in Non Patent Literature 2, and the effect cannot be obtained.

In the configuration of the high-frequency field generator 201 shown in FIG. 11A, the spin torque acts on the negative perpendicular magnetic anisotropy body 11 compared to the configuration of the high-frequency field generator 201 shown in FIG. 10A. Therefore, an operation at a higher frequency is stable, and the rise of the oscillation tends to be faster. Although 2 nm-Cu is used for the metal non-magnetic spin conduction layer 3, Ru or the like which is a metal non-magnetic material with high spin conductivity may be used. In the negative perpendicular magnetic anisotropy body 11, a 001 plane of hexagonal CoIr is set in the horizontal direction in the drawings, and the size of the magnetic anisotropy is $6.0 \times 10^5$ J/m$^3$. As the magnetic material with negative perpendicular magnetic anisotropy is set adjacent to the FGL 2, an effect of retaining the magnetization direction of the FGL 2 in the perpendicular direction of the rotation axis is strengthened. The same effect can be expected by $\alpha'$-FeC, dhcp CoFe, NiAs-type MnSb, and the like that are known as magnetic materials with negative perpendicular magnetic anisotropy. Since the CoFe alloy is used for the FGL 2, there is large exchange coupling just like CoIr even if $\alpha'$-FeC or dhcp CoFe is used, and an effect of retaining the magnetization direction in the perpendicular direction of the rotation axis increases. If the $(Co/Fe)_n$ artificial lattice film with negative perpendicular magnetic anisotropy is used for the FGL 2, the magnetization of about the same level as in the CoFe alloy can be obtained. Therefore, the magnetization rotation is stabilized without arranging the negative perpendicular magnetic anisotropy body 11, and an excellent oscillation property can be obtained. For the metal non-magnetic spin scatterer 12, 3 nm-Pt is used. There is a similar effect when Pd is used. For the opposing pole lip 13, a 10 nm CoFe alloy is used. The FGL magnetization rotation is stabilized if a material with relatively weak perpendicular magnetic anisotropy, such as a $(Co/Ni)_n$ artificial lattice film, is used for the opposing pole lip 13 in contact with the metal non-magnetic spin conduction layer 3. The larger the high-frequency excitation current (electron flow), the greater the spin torque. The spin torque also increases if about 1 nm CoFeB layer with large polarizability is inserted between the lip 8 and the metal non-magnetic spin conduction layer 3.

For the recording medium 7, a 10 nm CoCrPt—SiO$_x$ layer with 2.4 MA/m (30 kOe) magnetic anisotropy effective field is used as a lower recording layer 18, and a 6 nm-(Co/Pt)—

$SiO_x$ artificial lattice layer with 1.4 kA/m (17 kOe) magnetic anisotropy effective field is used as an upper recording layer 17 on the substrate 19. As a result of measurement of absorption line-width based on the ferromagnetic resonance, damping constants α of the upper recording layer 17 and the lower recording layer 18 are 0.20 and 0.02, respectively. If there are a Pt layer and a Pd layer, α can be increased, and the magnetization switching can be speeded up. After the formation of the continuous medium by sputtering, a discrete track medium with 25 nm length in the track direction and 35 nm track pitch is created based on the nanoimprint lithography. A spinstand is used to perform magnetic recording based on relative velocity of 20 m/s between head and medium, 5 nm head-medium spacing, and 35 nm track pitch, and reading is further performed by a GMR head of 25 nm shield gap length.

As a result of changing the high-frequency excitation current to measure the signal/noise ratio at 1250 kFCI, 13.0 dB is obtained at the maximum, and it is recognized that recording reading of areal recording density over 1.8 T bits per square inch can be sufficiently attained. The high frequency at this point is 27.0 GHz. For comparison, the recording reading property of the medium before the discrete track processing is measured at relative velocity of 20 m/s between head and medium, 5 nm head-medium spacing, and 27.0 GHz. The signal is recorded by changing the track pitch before the formation of the track, and the signal/noise ratio is greater than 13.0 dB at 1250 kFCI when the track pitch is 40 nm. It can be recognized from the result that the recording heading of the areal recording density over 1.5 T bits per square inch can be sufficiently attained even in the continuous medium.

The write head and the recording medium described above are incorporated into the magnetic disk device shown in FIGS. 13A and 13B to evaluate the performance. An information recording reading device utilizing a high-frequency rotating field of 0.8 T bytes (1.3 T bits per square inch) on each surface of three 2.5-inch magnetic disks in the continuous medium, or 5 T bytes recording capacity in total, and of 1.2 T bytes (1.7 T bits per square inch) in the discrete track medium, or 7 T bytes recording capacity in total, is obtained. In the FGL structure used in the present embodiment, the aspect ratio of the cross section perpendicular to the electric current can be relatively freely set. Therefore, the design in accordance with the fringing field from the main pole with a structure optimal for the used recording medium is possible.

Third Embodiment

Figure 12A:
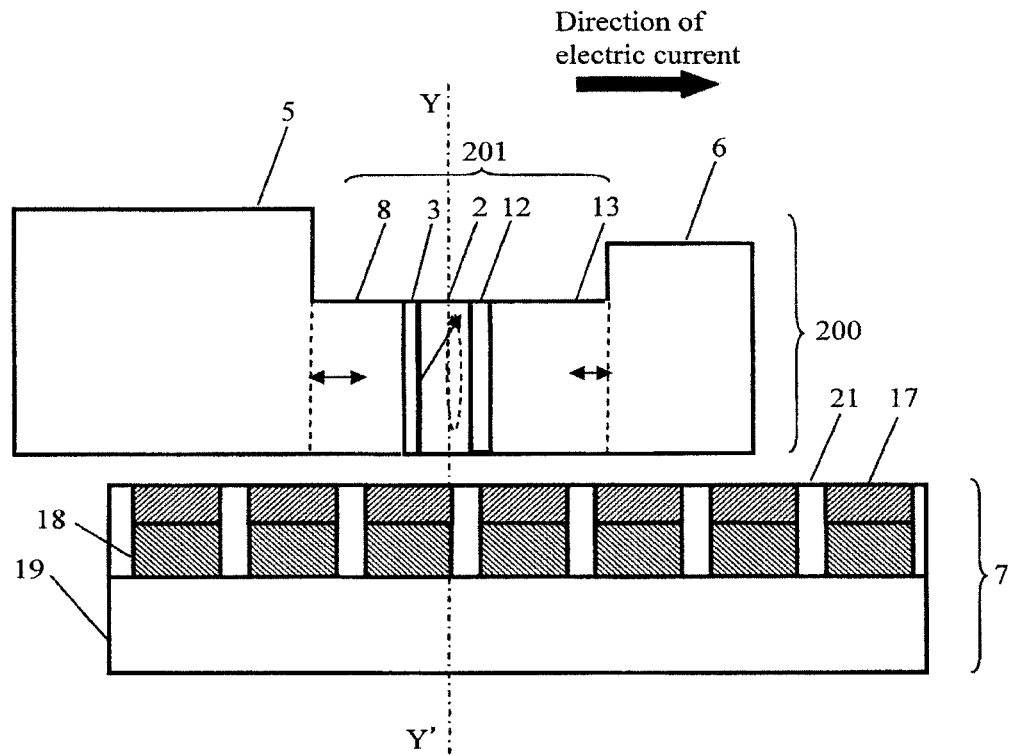
FIG. 12A is a schematic diagram of a cross section depicting the write head and the recording medium of a third embodiment from the write track width direction.
Figure 12B:
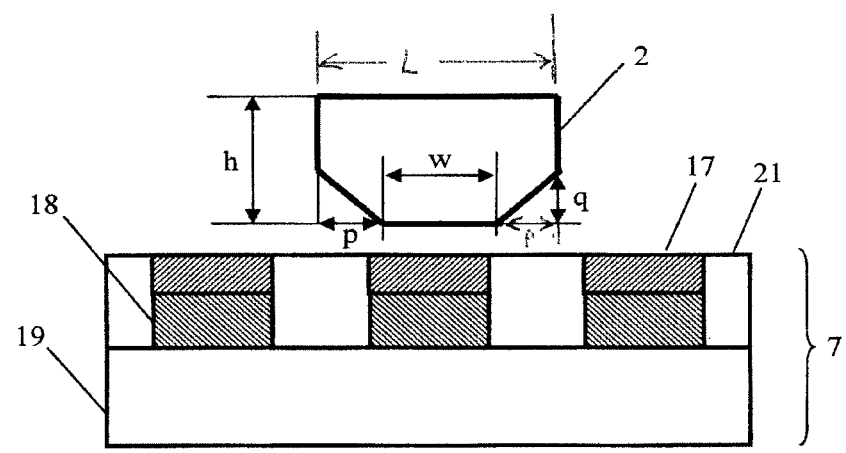
FIG. 12B is a cross-sectional view depicting the schematic diagram shown in FIG. 12A from a direction after cutting at a segment Y-Y'.

FIGS. 12A and 12B are diagrams showing a third example of configuration of the write head and the recording medium according to the present invention. The main pole 5, the opposing pole 6, and configurations on the upper and left sides of FIGS. 12A and 12B used in the present example of configuration are the same as in the first example of configuration. Adjacent to the main pole 5, the lip 8, the metal non-magnetic spin conduction layer 3, the FGL (magnetization fast rotating body) 2, the metal non-magnetic spin scatterer 12, and the opposing pole lip 13 are arranged in layers through to the opposing pole 6. From the lip 8 to the opposing pole lip 13 have a columnar structure extending in the horizontal direction on FIGS. 12A and 12B, and the cross section is hexagonal in which the edge in the track width direction of a trapezoid, which includes a side along the air bearing surface shorter than the opposing side, is chopped off at a plane perpendicular to the medium surface (see FIG. 12B). FIG. 12B shows an FGL with a height "h", a cut-away section "q" of height "h", a width "w", a longer width "L" equal to "w" plus two times "p". The hexagonal shape allows matching peak positions of the ellipticity of the FGL magnetic field and the switching-assisted effective magnetic AC field while maintaining the shape anisotropy in the write track width direction, and an excellent writing property can be expected.

A width w of the side along the hexagonal air bearing surface is an important factor for determining the write track width and is 15 nm in the present embodiment. A material with the same or greater saturation magnetization than the main pole 5 is used for the lip 8, and a 3D field simulator is used to design the thickness of the lip 8 so that the magnetic field from the main pole 5 is perpendicular to the layer direction of the FGL 2 as much as possible. Although the thickness of the lip 8 in the present embodiment is 8 nm, the value depends on the hexagonal shape, the distance to the opposing pole and the condition, the condition of the medium used, and the condition of the magnetic circuits on the upper side of the drawings.

The FGL 2 is made of a CoFe alloy of 25 nm thickness with large saturation magnetization and with almost no magnetic crystalline anisotropy. There is the same level of magnetization as in the CoFe alloy if a $(Co/Fe)_n$ artificial lattice film with negative perpendicular magnetic anisotropy is used for the FGL 2. Therefore, the magnetization rotation is stabilized, and an excellent oscillation property can be obtained. In the FGL 2, the magnetization rapidly rotates in the plane along the layers, and the fringing field from the pole that emerges on the air bearing surface and the side acts as a high-frequency field. The driving force of the magnetization rotation of the FGL 2 is spin torque based on the spin reflected to the lip 8 through the metal non-magnetic spin conduction layer 3. The spin torque acts in a direction in which the magnetization components parallel to the magnetization rotation axis of the FGL 2 generated by the fringing field from the main pole 5 are reduced. To obtain the action of the spin torque, a high-frequency excitation (direct current) electric current needs to flow from the main pole 5 side to the opposing pole 6 side. The direction of the electric current is from the metal non-magnetic spin conduction layer 3 side to the FGL 2 side. The rotation direction of the magnetization of the FGL 2 is clockwise as seen from the upstream of the high-frequency excitation (direction current) electric current when the magnetic field flows to the main pole 5, and a magnetic field rotating in the same direction as the direction of the precession of the magnetization of the recording medium that switches by the magnetic field to the main pole 5 can be applied. Therefore, the circularly-polarized high-frequency field of the FGL 2 has an effect of assisting the magnetization switching by the main pole 5 regardless of the polarity of the main pole 5. As in the first embodiment, the direction of the spin torque is not changed by the polarity of the main pole 5 in the present effect of the high-frequency field generator in a format described in Non Patent Literature 2, and the effect cannot be obtained.

The larger the high-frequency excitation current (electron flow), the greater the spin torque effect. The spin torque effect also increases if about 1 nm CoFeB layer with large polarizability is inserted between the metal non-magnetic spin conduction layer 3 and the adjacent layer.

Although 2 nm-Cu is used for the metal non-magnetic spin conduction layer 3, Ru or the like which is a metal non-magnetic material with high spin conductivity may be used. For the metal non-magnetic spin scatterer 12, 3 nm-Pt is used. There is a similar effect when Pd is used. For the opposing pole lip 13, a 15 nm CoFe alloy is used.

In the recording medium 7, a 6 nm-(Co/Pt) artificial lattice layer with 2.8 MA/m (34 kOe) magnetic anisotropy effective field is used as the upper recording layer 17, and a 6 nm-FePt layer with 4.8 MA/m (60 kOe) magnetic anisotropy effective field is used as the lower recording layer 18. As a result of measurement of absorption line-width based on the ferromagnetic resonance, damping constants α of the upper recording layer 17 and the lower recording layer 18 are 0.20 and 0.02, respectively. If a rich area of Pt or Pd touches the magnetic material, the magnetization is induced in the area, and there is an action of braking the change in the direction of the magnetization. Therefore, the damping factor α can be increased. Even if the artificial lattice structure is not used, the damping factor α is large in a CoCrPt magnetic material with a large Pt composition. As a material with relatively small magnetic anisotropy and large α is used as the upper recording layer 17 at a position close to the writing head 200, a recording medium that is capable of fast switching at low frequency and that is resistant to thermal fluctuation can be realized.

After the formation of the continuous medium by sputtering, electron beam recording is used to perform etching to arrange a magnetic material pattern with 15 nm length in the track direction and 9 nm in the down track direction at 20 nm track pitch and 12.5 nm bit pitch. $SiO_x$ is embedded in spaces 21 between patterns. A spinstand is used to perform magnetic recording based on relative velocity of 20 m/s between head and medium, 5 nm head-medium spacing, and 20 nm track pitch, and reading is further performed by a GMR head of 20 nm shield gap length. As a result of changing the high-frequency excitation current to change the oscillation frequency to measure the signal/noise ratio at 1000 kFCI, 15 dB is obtained at the maximum, and it is recognized that recording reading of areal recording density over 2 T bits per square inch can be sufficiently attained. The high frequency at this point is 28 GHz.

The write head and the recording medium described above are incorporated into the magnetic disk device shown in FIGS. 13A and 13B to evaluate the performance. An information recording reading device utilizing a high-frequency rotating field of 1.0 T bytes (2 T bits per square inch) on each surface of two 2.5-inch magnetic disks, or 4T bytes recording capacity in total, is obtained. The two-layer medium used in the present embodiment performs writing at a recording frequency in accordance with the upper layer 17 with small magnetic anisotropy. Therefore, the magnetic anisotropy of the lower section 18 with large magnetic anisotropy can be further enlarged to attain higher areal recording density. In that case, the width "w" that determines the track density of FIG. 12B can be reduced to perform writing to the recording medium with a higher-density pattern. As mentioned previously, FIG. 12B shows an FGL with a height "h", a cut-away portion "q" of height "h", a width "w", a longer width "L" equal to "w" plus two times "p".

Fourth Embodiment

Figure 14A:
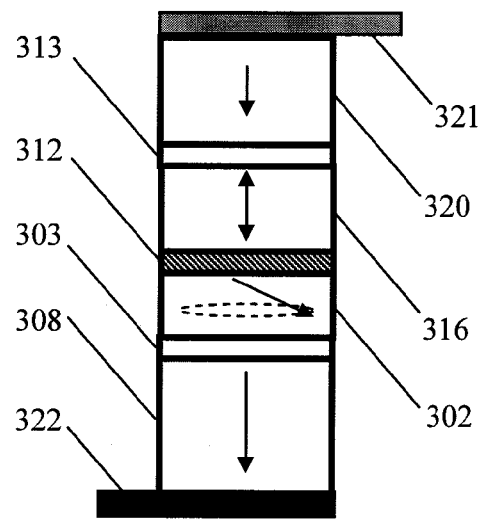
FIG. 14A is a block diagram of recording reading elements of a fourth embodiment.
Figure 14B:
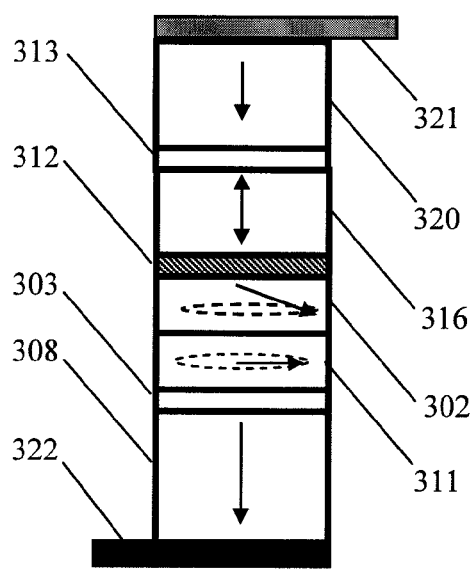
FIG. 14B is a block diagram of the recording reading elements of the fourth embodiment.

FIGS. 14A and 14B are diagrams showing a fourth example of configuration of the recording reading device according to the present invention. Adjacent to a high-frequency driving electrode 322, a perpendicular magnetic anisotropy body A (spin injection layer) 308, a metal non-magnetic spin conduction layer 303, an FGL (magnetization fast rotating body) 302, a metal non-magnetic spin scatterer 312, a magnetization recording layer 316, a non-magnetic spin transmission layer 313, and a perpendicular magnetic anisotropy body B (detection layer) 320 are arranged in layers through to a detection electrode 321. From the perpendicular magnetic anisotropy body A 308 to the perpendicular magnetic anisotropy body B 320 have a columnar structure extending in the vertical direction in FIGS. 14A and 14B, and the cross section is substantially a square. The square shape allows approximately setting ellipticity r=1 in the magnetic field applied from the FGL 302 to the magnetization recording layer 316. The length of one side of the square is 10 nm. The magnetization rotation of the FGL is stabilized if the negative perpendicular magnetic anisotropy body 311 is inserted between the metal non-magnetic spin conduction layer 303 and the FGL (magnetization fast rotating body) 302 (FIG. 14B). The perpendicular magnetic anisotropy body A (spin injection layer) 308 and the perpendicular magnetic anisotropy body B (detection layer) 320 have large perpendicular magnetic anisotropy in the vertical direction of FIGS. 14A and 14B, and the direction of the magnetization does not change after the magnetization at the initial stage.

In FIGS. 14A and 14B, the magnetization directions of the perpendicular magnetic anisotropy body A 308 and the perpendicular magnetic anisotropy body B 320 are illustrated in the same directions. However, the sizes of the magnetic anisotropy effective fields of the perpendicular magnetic anisotropy body A 308 and the perpendicular magnetic anisotropy body B 320 may be changed to control the magnetic field to make the directions opposite. If the magnetization is opposite, the effect of the magnetic field on the surrounding of the recording reading device according to the present invention is reduced. CoCrPt alloys with 0.8 MA/m (10 kOe) to 1.2 MA/m (15 kOe) perpendicular magnetic anisotropy effective fields are used for the perpendicular magnetic anisotropy body A 308 and the perpendicular magnetic anisotropy body B 320. The FGL 302 is made of a 25-nm-thick CoFe alloy with large saturation magnetization and with almost no magnetic crystalline anisotropy. There is the same level of magnetization as in the CoFe alloy if a $(Co/Fe)_n$ artificial lattice film with negative perpendicular magnetic anisotropy is used for the FGL 30. Therefore, the magnetization rotation is stabilized, and an excellent oscillation property can be obtained. In the FGL 302, the magnetization rapidly rotates in the plane along the layers, and the fringing field from the pole that emerges on the side acts as a high-frequency field on the magnetization recording layer 316. The magnetization rotation driving force of the FGL 302 is spin torque based on the spin injected or reflected from the perpendicular magnetic anisotropy body A (spin injection layer) 308 through the metal non-magnetic spin conduction layer 303. The injection and the reflection of the spin depend on the direction of the electric current applied between the high-frequency driving electrode 322 and the metal non-magnetic spin scatterer 312. The larger the electric current, the larger the spin torque and the larger the oscillation frequency of the FGL 302. Since the magnetization rotation direction of the FGL 302 changes depending on the direction of the electric current, the rotation direction of the circularly-polarized high-frequency field changes, and switching of the magnetization of the magnetization recording layer 316 can be controlled.

The spin torque action increases if about 1 nm CoFeB layer with large polarizability is inserted between the metal non-magnetic spin conduction layer 303 and the adjacent layer. Although 2 nm-Cu is used for the metal non-magnetic spin conduction layer 303, Ru or the like as a non-magnetic material with high spin conductivity may be used. Particularly, if CoIr is used as the negative perpendicular magnetic anisotropy body 311, the use of Ru can expect epitaxial growth of the perpendicular magnetic anisotropy body A 308, the metal non-magnetic spin conduction layer 303, and the negative perpendicular magnetic anisotropy body 311. The metal non-magnetic spin scatterer 312 has an effect of blocking the interaction between the FGL 302 and the magnetization recording layer 316 caused by the spin and serves as a ground electrode to form a writing circuit with the high-frequency driving electrode 322 and a writing circuit with the detection electrode 321. For the metal non-magnetic spin scatterer 312, 3 nm-Pt is used. There is a similar effect when Pd is used.

If the magnetization recording layer 316 is too thick, the magnetization recording layer 316 is insusceptible to the magnetic field of the FGL 302. Therefore, the thickness needs to be controlled to about the length of one side of the square as the cross section. Meanwhile, the magnetization recording layer 316 needs to continue holding the recording magnetization against the thermal fluctuation. Therefore, equal or greater perpendicular magnetic anisotropy energy than the perpendicular magnetic anisotropy body A 308 and the perpendicular magnetic anisotropy body B 320 is required. Although a 6 nm-(Co/Pt) artificial lattice layer of 2.8 MA/m (34 kOe) is used in the present embodiment, FePt and CoPt alloys may be used. To detect the magnetization state of the magnetization recording layer 316, the resistance change of the electric current flowing to the perpendicular magnetic anisotropy body B (detection layer) 308 through the non-magnetic spin transmission layer 313 can be observed as a TMR or GMR effect. To utilize the TMR effect, MgO can be used as the non-magnetic spin transmission layer 313. To utilize the GMR effect, Cu can be used as the non-magnetic spin transmission layer 313.

Figure 15A:
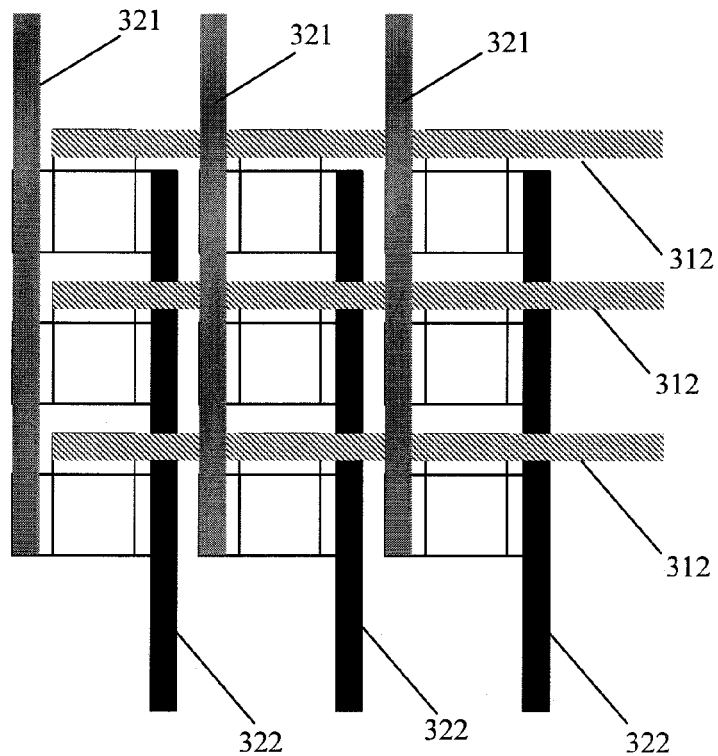
FIG. 15A is a diagram showing an example of an electrode pattern for integrating the recording reading elements shown in FIGS. 14A and 14B.
Figure 15B:
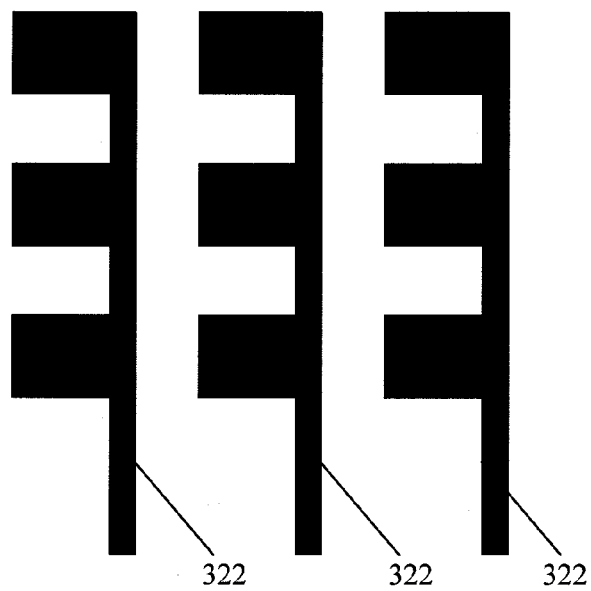
FIG. 15B is an example of the electrode pattern for integrating the recording reading elements shown in FIGS. 14A and 14B.
Figure 15C:
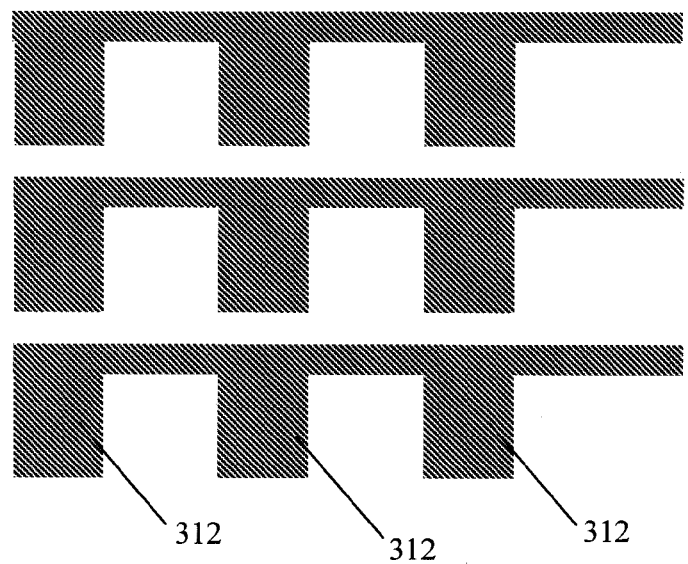
FIG. 15C is a diagram showing an example of the electrode pattern for integrating the recording reading elements shown in FIGS. 14A and 14B.
Figure 15D:
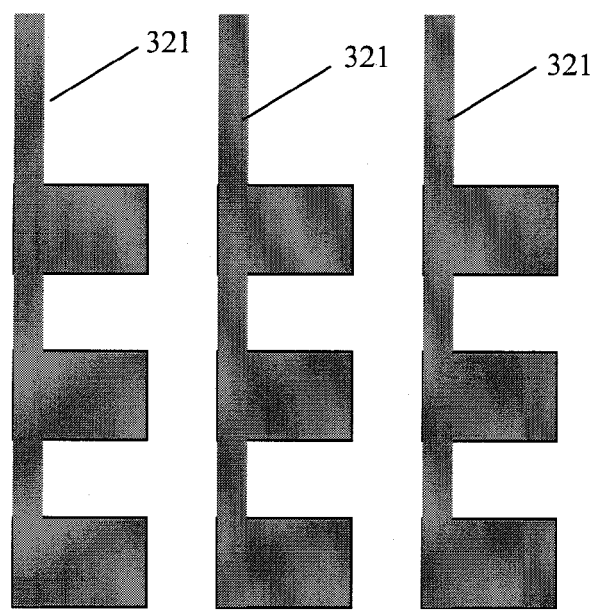
FIG. 15D is a diagram showing an example of the electrode pattern for integrating the recording reading elements shown in FIGS. 14A and 14B.
Figure 15E:
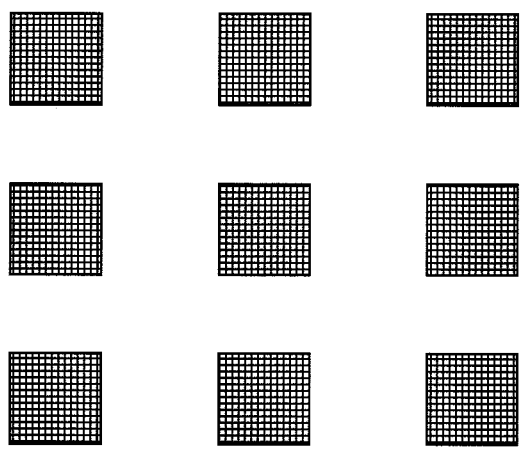
FIG. 15E is a schematic diagram of an integrated structure of the recording reading elements shown in FIGS. 14A and 14B.

FIGS. 15A to 15E will be used to show methods of integrating the recording reading elements shown in FIGS. 14A and 14B. Although examples of 3×3 are illustrated in FIGS. 15A to 15E, there is fundamentally no problem if an arbitrary number of lattices is formed. A pattern of the FGL 302, the metal non-magnetic spin conduction layer 303, the perpendicular magnetic anisotropy body A 308, the negative perpendicular magnetic anisotropy body 311, the non-magnetic spin transmission layer 313, the magnetization recording layer 316, and the perpendicular magnetic anisotropy body B 320 forms a lattice of 10 nm square and 25 nm pitch as shown in FIG. 15E, and the areal recording density is 1 T bits per square inch.

The above described recording reading elements are created in an area of 0.25 mm×0.25 mm (10000×10000 elements) to evaluate the performance. A 10M-byte magnetic memory of average writing time 3 ns is obtained.

FIGS. 15B to 15D show electrode patterns of the high-frequency driving electrode 322, the metal non-magnetic spin scatterer 312, and the detection electrode 321, respectively. Upon magnetic recording of information, the high-frequency driving electrode 322 and the metal non-magnetic spin scatterer 312 corresponding to the recording bit are selected, and the electric current is applied in a necessary direction. Upon reading of information, the detection electrode 321 and the metal non-magnetic spin scatterer 312 corresponding to the recording bit are selected, and the resistance value that changes with the direction of the electric current is measured to determine the magnetization direction. As a result of creating 1024×1024 elements for trial and changing the electric current value to measure the error rate, errors are not detected when the high frequency during magnetic recording is between 20 GHz to 32 GHz.

REFERENCE SIGNS LIST

2 FGL
3 metal non-magnetic spin conduction layer
5 main pole
6 opposing pole
7 recording medium
8 lip
11 negative perpendicular magnetic anisotropy body
12 metal non-magnetic spin scatterer
13 opposing pole lip
16 recording layer
17 upper recording layer
18 lower recording layer
19 substrate
21 space between patterns
200 write head
201 high-frequency field generator
205 coil
206 auxiliary pole
207 GMR element
208 shield film
209 insulator
101 recording medium
102 slider
103 rotary actuator
104 rotation bearing
105 arm
106 suspension
108 casing
109 recording reader
302 FGL
303 metal non-magnetic spin conduction layer
312 metal non-magnetic spin scatterer
308 perpendicular magnetic anisotropy body A (spin injection layer)
311 negative perpendicular magnetic anisotropy body
313 non-magnetic spin transmission layer
316 magnetization recording layer
320 perpendicular magnetic anisotropy body B (detection layer)
321 detection electrode
322 high-frequency driving electrode

The invention claimed is:

1. An information recording device that includes a magnetic recording medium configured to store user data, and a magnetic head comprising a write head configured to perform a recording operation to the magnetic recording medium, and the write head configured to apply a high-frequency field and a write magnetic field corresponding to the user data to the magnetic recording medium, in order to form a magnetic resonance state in the magnetic recording medium to perform magnetic recording, the write head comprising:
   a main pole configured to generate the write magnetic field;
   an opposing pole arranged on a trailing side or a leading side of the main pole apart from the main pole; and
   a multilayer material arranged between the main pole and the opposing pole, and configured to generate the high-frequency field,
   wherein the multilayer material includes a receded section formed at a track direction end section at an air bearing surface of the multilayer material; and
   wherein for a cross-section of the multilayer material, the cross-section being parallel to both the main pole and the opposing pole, the cross-section has a shape such that the width of the cross-section at the air bearing surface side of the multilayer material is shorter than the width at the side of the multilayer material opposite to the air bearing surface side.

2. The information recording device according to claim 1, wherein the receded section includes a tapered section arranged at the track direction end section.

3. The information recording device according to claim 1, wherein the receded section includes a stepped section arranged at the track direction end section.

4. The information recording device according to claim 1, wherein the magnetic recording medium is a discrete track medium.

5. The information recording device according to claim 1, wherein the magnetic recording medium is a bit patterned medium.

6. The information recording device according to claim 1, wherein for a Field Generation Layer (FGL) of the multilayer material, a side along the air bearing surface is shorter than a side opposing the side along the air bearing surface, in the height direction in the shape of the cross-section perpendicular to an electric current flowing through the FGL.

7. An information recording device that includes a magnetic recording medium configured to store user data, and a magnetic head comprising a write head configured to perform a recording operation to the magnetic recording medium, and the write head configured to apply a high-frequency field and a write magnetic field corresponding to the user data to the magnetic recording medium, in order to form a magnetic resonance state in the magnetic recording medium to perform magnetic recording, the write head comprising:

a main pole configured to generate the write magnetic field;
an opposing pole arranged on a trailing side or a leading side of the main pole apart from the main pole; and
a multilayer material arranged between the main pole and the opposing pole, and configured to generate the high-frequency field,
wherein for a cross-section of the multilayer material, the cross-section being parallel to both the main pole and the opposing pole, the cross-section has a trapezoidal shape, and the width of the cross-section at an air bearing surface side of the multilayer material is shorter than the width at the side of the multilayer material opposite to the air bearing surface side.

8. The information recording device according to claim 7, wherein the magnetic recording medium is a discrete track medium.

9. The information recording device according to claim 7, wherein the magnetic recording medium is a bit patterned medium.

10. The information recording device according to claim 7, wherein for a Field Generation Layer (FGL) of the multilayer material, a side along the air bearing surface is shorter than a side opposing the side along the air bearing surface, in the height direction in the shape of the cross-section perpendicular to an electric current flowing through the FGL.

* * * * *